(12) United States Patent
Chou et al.

(10) Patent No.: US 12,159,821 B2
(45) Date of Patent: Dec. 3, 2024

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Ting-Yang Chou, Taichung (TW); Yih-Jenn Jiang, Taichung (TW); Don-Son Jiang, Taichung (TW)

(73) Assignee: SILICONWARE PRECISION INDUSTRIES CO., LTD, Taichung (TW)

( * ) Notice: Subject to any disclaimer, the term of this patent is extended or adjusted under 35 U.S.C. 154(b) by 414 days.

(21) Appl. No.: 17/748,920

(22) Filed: May 19, 2022

(65) Prior Publication Data

US 2023/0307339 A1    Sep. 28, 2023

(30) Foreign Application Priority Data

Mar. 24, 2022  (TW) .................................. 111111159

(51) Int. Cl.
| | |
|---|---|
| *H01L 23/498* | (2006.01) |
| *H01L 21/48* | (2006.01) |
| *H01L 25/10* | (2006.01) |
| *H01L 23/552* | (2006.01) |
| *H01L 25/04* | (2023.01) |
| *H01L 25/11* | (2006.01) |

(52) U.S. Cl.
CPC .... *H01L 23/49822* (2013.01); *H01L 21/4857* (2013.01); *H01L 23/49811* (2013.01); *H01L 23/49838* (2013.01); *H01L 25/105* (2013.01); *H01L 23/552* (2013.01); *H01L 25/043* (2013.01); *H01L 25/117* (2013.01)

(58) Field of Classification Search
CPC ......... H01L 23/49822; H01L 23/49811; H01L 25/105; H01L 23/552; H01L 2225/1041; H01L 25/043; H01L 25/117; H01L 21/4846

See application file for complete search history.

(56) References Cited

U.S. PATENT DOCUMENTS

| | | | |
|---|---|---|---|
| 2019/0207304 A1* | 7/2019 | Kim | ........................ H01L 24/25 |
| 2020/0152570 A1* | 5/2020 | Lu | ..................... H01L 23/49816 |

* cited by examiner

*Primary Examiner* — David Vu
*Assistant Examiner* — Brandon C Fox
(74) *Attorney, Agent, or Firm* — Dority & Manning, P.A.

(57) ABSTRACT

An electronic package is provided, and the manufacturing method of which is to form a plurality of conductive pillars and dispose an electronic element on a first circuit structure, then cover the plurality of conductive pillars and the electronic element with a cladding layer, and then form a second circuit structure on the cladding layer, so that the plurality of conductive pillars are electrically connected to the first circuit structure and the second circuit structure, and the electronic element is electrically connected to the first circuit structure, where a fan-out redistribution layer is configured in the first circuit structure and the second circuit structure, and at least one ground layer is configured in the second circuit structure. Further, the ground layer includes a plurality of sheet bodies arranged in an array, so that at least one slot is disposed between every two adjacent sheet bodies.

24 Claims, 25 Drawing Sheets

ELECTRONIC PACKAGE AND MANUFACTURING METHOD THEREOF

BACKGROUND

1. Technical Field

The present disclosure relates to an electronic package and a manufacturing method thereof, and more particularly, to an electronic package with a ground layer and a manufacturing method thereof.

2. Description of Related Art

With the vigorous development of portable electronic products in recent years, various related products are gradually developing towards the trend of high density, high performance, lightness, thinness, shortness and smallness. Various types of package on package (PoP) processes have also been introduced to meet the requirements of light, thin, short, and high density.

As shown in FIG. 1, which is a schematic cross-sectional view of a conventional PoP device 1, the PoP device 1 includes two stacked package structures 1a, 1b.

The lower package structure 1a includes a first substrate 11 having a first surface 11a and a second surface 11b opposite to each other, a first electronic element 10 bonded to the first substrate 11 in a flip-chip manner, electrical contact pads 111 disposed on the first surface 11a, a first encapsulant 13 formed on the first substrate 11 to cover the first electronic element 10, a solder material 114 formed on the electrical contact pads 111 in openings 130 of the first encapsulant 13, and ball placement pads 112 disposed on the second surface 11b for bonding solder balls 14.

The upper package structure 1b includes a second substrate 12, a plurality of second electronic elements 15a, 15b bonded onto the second substrate 12 by wire bonding, and a second encapsulant 16 formed on the second substrate 12 to cover the plurality of second electronic elements 15a, 15b, so that the second substrate 12 is stacked on and electrically connected to the electrical contact pads 111 of the first substrate 11 via the solder material 114.

However, in the conventional PoP device 1, due to the difference in structure and material properties between the first substrate 11 and the second substrate 12, the first substrate 11 and the second substrate 12 are prone to warpage during the manufacturing process.

Furthermore, the conventional first substrate 11 and the second substrate 12 both adopt the conventional package substrate specifications, which have a core layer, so that it is difficult to reduce the thickness of the first substrate 11 and the second substrate 12, and cannot effectively reduce the overall package height of the PoP device 1.

Therefore, how to overcome the above-mentioned drawbacks of the prior art has become an urgent issue to be solved at present.

SUMMARY

In view of the various deficiencies of the prior art, the present disclosure provides an electronic package, comprising: a cladding layer with a first surface and a second surface opposite to each other; a first circuit structure disposed on the first surface of the cladding layer and configured with a fan-out redistribution layer; a second circuit structure disposed on the second surface of the cladding layer and configured with another fan-out redistribution layer; a plurality of conductive pillars embedded in the cladding layer and electrically connected to the first circuit structure and the second circuit structure; an electronic element disposed on the first circuit structure, embedded in the cladding layer and electrically connected to the first circuit structure or the second circuit structure; and at least one ground layer disposed in at least one of the first circuit structure and the second circuit structure, wherein the at least one ground layer includes a plurality of sheet bodies arranged in an array, and at least one slot is disposed between any two adjacent ones of the sheet bodies.

The present disclosure also provides a method of manufacturing an electronic package, comprising: forming a plurality of conductive pillars and disposing an electronic element on a first circuit structure; forming a cladding layer on the first circuit structure to cover the plurality of conductive pillars and the electronic element; and forming a second circuit structure on the cladding layer, wherein the plurality of conductive pillars are electrically connected to the first circuit structure and the second circuit structure, and the electronic element is electrically connected to the first circuit structure or the second circuit structure, wherein the first circuit structure and the second circuit structure include a fan-out redistribution layer, and at least one ground layer is disposed in at least one of the first circuit structure and the second circuit structure, and wherein the at least one ground layer includes a plurality of sheet bodies arranged in an array, and at least one slot is disposed between any two adjacent ones of the sheet bodies.

In the aforementioned electronic package and the manufacturing method thereof, at least one of the first circuit structure and the second circuit structure is provided with a plurality of the ground layers, and positions of the sheet bodies of any two adjacent ones of the ground layers are vertically corresponding to each other, and the slots of the any two adjacent ones of the ground layers are free from overlapping in a vertical direction. Further, the present disclosure further comprises a plurality of conductors respectively corresponding to the plurality of sheet bodies and disposed between the two adjacent ones of the ground layers, wherein the sheet bodies of the any two adjacent ones of the ground layers are electrically connected via at least one of the plurality of conductors.

In the aforementioned electronic package and the manufacturing method thereof, each of the sheet bodies has at least one hole. For example, at least one of the first circuit structure and the second circuit structure is provided with a plurality of the ground layers, and positions of the sheet bodies of the any two adjacent ones of the ground layers are vertically corresponding to each other, and the holes of the any two adjacent ground layers are free from overlapping in a vertical direction. Alternatively, a total area of the at least one hole accounts for at least 10% or more of an area of a vertical projection of an outer contour of each of the sheet bodies.

In the aforementioned electronic package and the manufacturing method thereof, the at least one slot is disposed at a position corresponding to a central position of an edge of each of the sheet bodies.

In the aforementioned electronic package and the manufacturing method thereof, a plurality of slots arranged in an array are disposed between any two adjacent ones of the plurality of sheet bodies.

In the aforementioned electronic package and the manufacturing method thereof, the plurality of slots formed between the plurality of sheet bodies are communicated with each other to form a cross-shaped slotted hole at a position corresponding to a corner of each of the sheet bodies. Further, a plurality of slots arranged in an array are disposed between the adjacent cross-shaped slotted holes and positioned corresponding to a central position of an edge of the sheet body.

In the aforementioned electronic package and the manufacturing method thereof, the plurality of sheet bodies are rectangular, and a total length of the at least one slot accounts for at least 60% or more of a side length of a corresponding edge of each of the sheet bodies parallel to a length of the at least one slot.

In the aforementioned electronic package and the manufacturing method thereof, the plurality of sheet bodies are rectangular, and a total width of the at least one slot accounts for at least 1% or more of a side length of a corresponding edge of each of the sheet bodies parallel to a width of the at least one slot.

It can be seen from the above that, in the electronic package of the present disclosure and the manufacturing method thereof, the first circuit structure and the second circuit structure are fabricated by using a fan-out redistribution layer to replace the conventional package substrate with a core layer. Therefore, compared with the prior art, the electronic package of the present disclosure can effectively reduce the overall package height.

Furthermore, the present disclosure improves the flexibility of the overall circuit structure through the design of the sheet bodies, the holes and the slots of the ground layer. Therefore, compared with the prior art, the electronic package of the present disclosure can have better warpage control performance, so as to improve the bonding yield of the package module subsequently disposed on the second circuit structure.

DETAILED DESCRIPTIONS

The following describes the implementation of the present disclosure with examples. Those skilled in the art can easily understand other advantages and effects of the present disclosure from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "upper," "first," "second," "one" and the like used herein are merely used for clear explanation rather than limiting the practicable scope of the present disclosure, and thus, alterations or adjustments of the relative relationships thereof without essentially altering the technical contents should still be considered in the practicable scope of the present disclosure.

FIGS. 2A to 2F are schematic cross-sectional views illustrating a manufacturing method of an electronic package 2 according to a first embodiment of the present disclosure.

Figure 1:
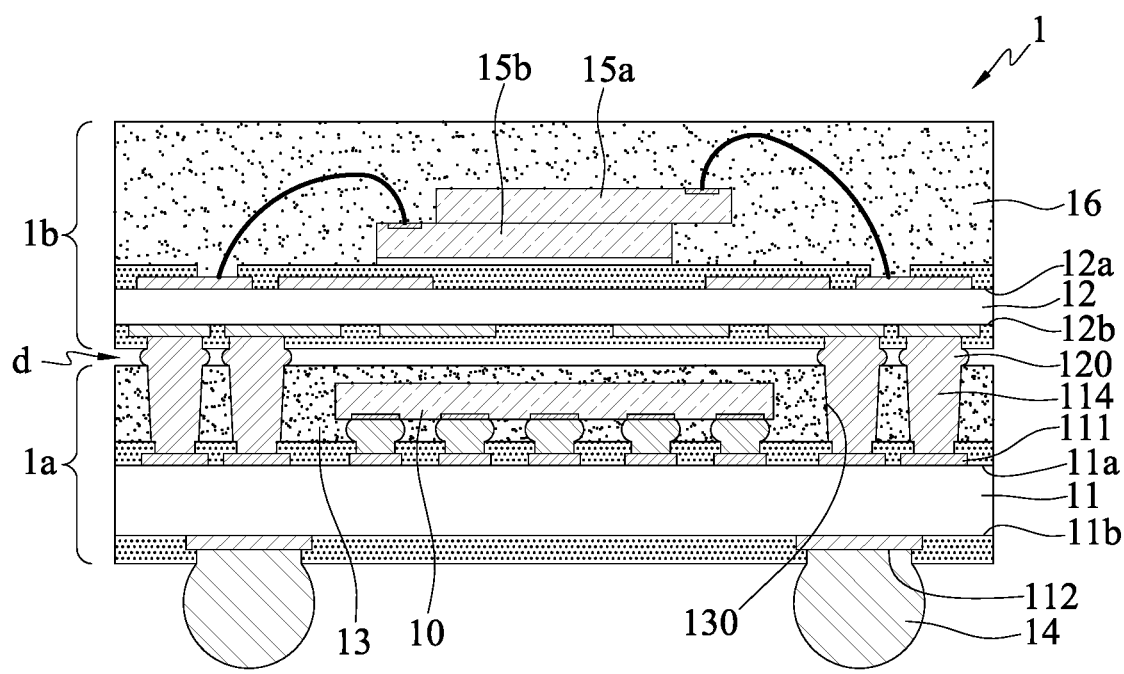
FIG. 1 is a schematic cross-sectional view of a conventional package on package device.
Figure 2A:
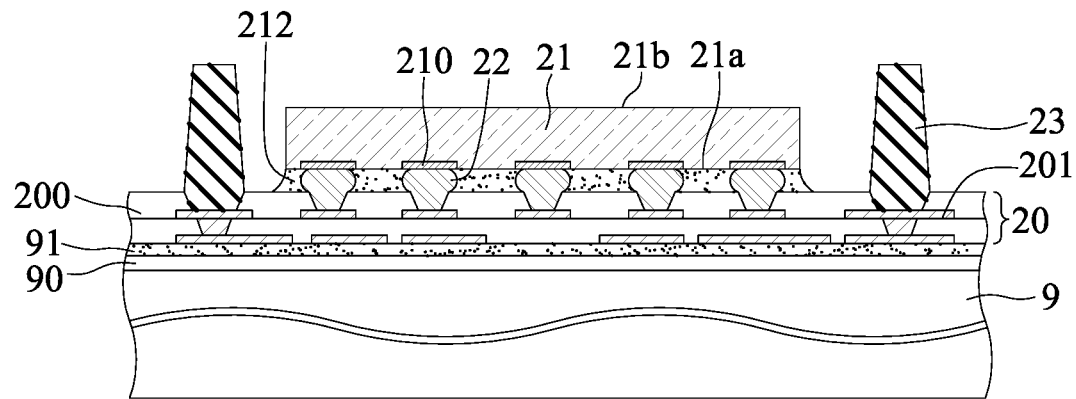
FIGS. 2A to 2F are schematic cross-sectional views illustrating a manufacturing method of an electronic package according to a first embodiment of the present disclosure.

As shown in FIG. 2A, a first circuit structure 20 is disposed on a carrier board 9, and a plurality of conductive pillars 23 are formed on the first circuit structure 20, and at least one electronic element 21 is disposed on the first circuit structure 20 via a plurality of conductive bumps 22.

In an embodiment, the first circuit structure 20 is coreless, which includes a plurality of dielectric layers 200 and a fan-out redistribution layer (FORDL) 201 disposed on the dielectric layer 200. For example, the material for forming the redistribution layer 201 is copper, and the material for forming the dielectric layer 200 is a dielectric material such as polybenzoxazole (PBO), polyimide (PI), prepreg (PP) and the like.

Furthermore, the carrier board 9 is, for example, a plate body made of semiconductor material (such as silicon or glass), on which a release layer 90 and an adhesive layer 91 can be formed in sequence according to the requirements for the dielectric layer 200 to be disposed on the adhesive layer 91.

In addition, the conductive pillars 23 are formed on the redistribution layer 201 by electroplating to electrically connect the redistribution layer 201, and the material for forming the conductive pillars 23 is a metal material such as copper or solder material.

In addition, the electronic element 21 is an active element, a passive element, or a combination of the active element and the passive element, such as a semiconductor chip, a through silicon interposer (TSI) with a conductive through-silicon via (TSV) 101, a resistor, a capacitor, or an inductor. In an embodiment, the electronic element 21 is a semiconductor chip, which has an active surface 21a and an inactive surface 21b opposite to each other, wherein the electronic element 21 is disposed on the redistribution layer 201 with electrode pads 210 of its active surface 21a by a plurality of conductive bumps 22 such as copper pillars, solder balls, etc. in a face down flip-chip manner and is electrically connected to the redistribution layer 201, and the conductive bumps 22 are covered with an underfill 212; alternatively, the electronic element 21 is disposed on the first circuit structure 20 with its inactive surface 21b, and can be electrically connected to the redistribution layer 201 by a plurality of bonding wires (not shown) in a wire-bonding manner. However, the manner in which the electronic element 21 is electrically connected to the redistribution layer 201 is not limited to the above.

Figure 2B:
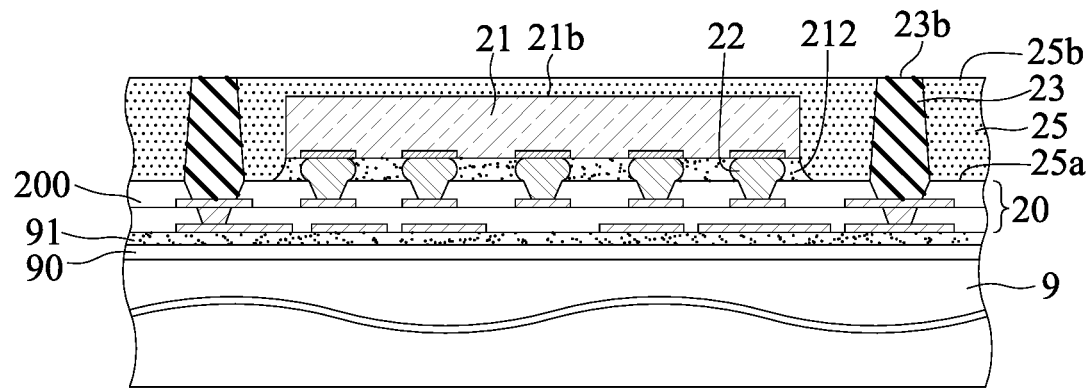

As shown in FIG. 2B, a cladding layer 25 is formed on the first circuit structure 20, so that the cladding layer 25 covers the electronic element 21, the underfill 212 and the conductive pillars 23, wherein the cladding layer 25 has a first surface 25a and a second surface 25b opposite to each other, and the first surface 25a is bonded to the dielectric layer 200. Next, through a leveling process, the second surface 25b of the cladding layer 25 is flush with end surfaces 23b of the conductive pillars 23, so that the end surfaces 23b of the conductive pillars 23 are exposed from the second surface 25b of the cladding layer 25.

In an embodiment, the cladding layer 25 is an insulating material, such as an epoxy resin encapsulant, which can be formed on the dielectric layer 200 by lamination or molding.

Furthermore, the leveling process removes partial materials of the conductive pillars 23 and partial materials of the cladding layer 25 by grinding. It should be understood that the cladding layer 25 can cover the inactive surface 21b of the electronic element 21 or expose the inactive surface 21b of the electronic element 21.

Figure 2C:
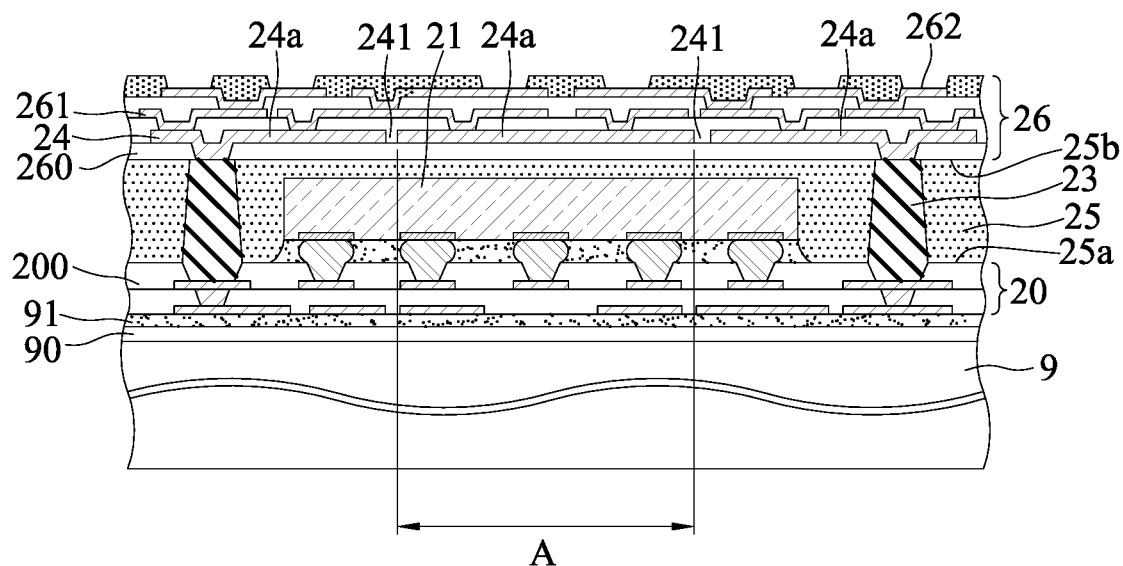

As shown in FIG. 2C, a second circuit structure 26 is formed on the second surface 25b of the cladding layer 25, and the second circuit structure 26 is electrically connected to the conductive pillars 23, wherein the second circuit structure 26 has a ground layer 24. In addition, the electronic element 21 can also be selected to be disposed on the first circuit structure 20 with its inactive surface 21b and is electrically connected to the redistribution layer 261 of the second circuit structure 26 via a conductive material (not shown) such as metal bumps, conductive glue or solder in a face up manner.

Figure 2D:
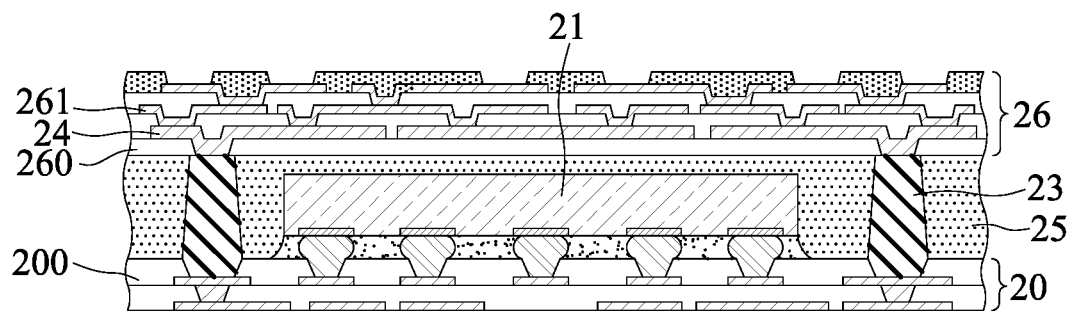
Figure 2E:
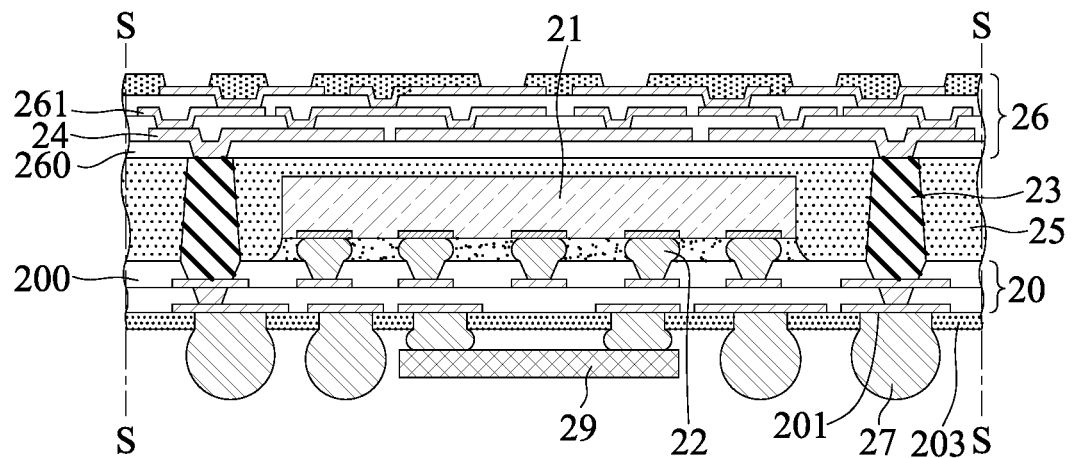
Figure 2F:
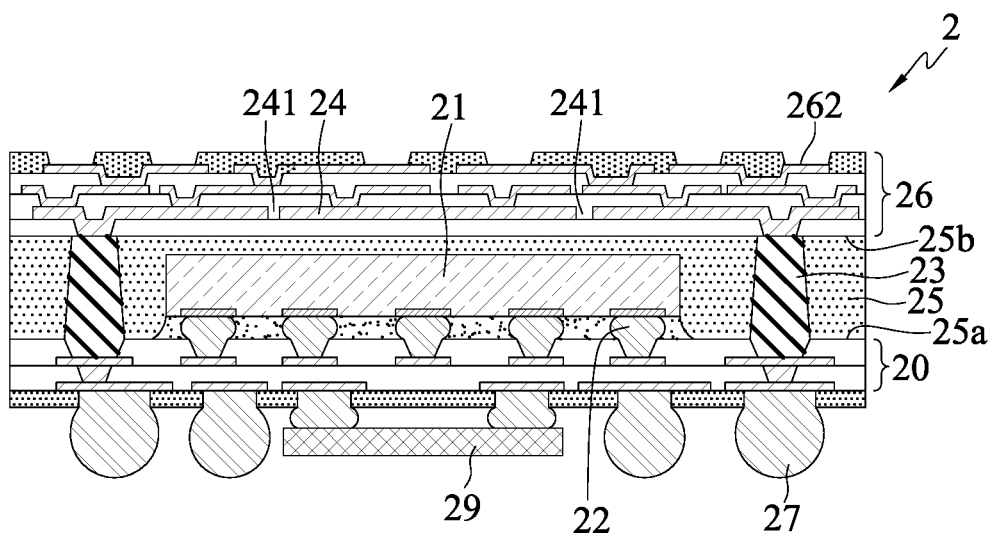
Figure 2G:
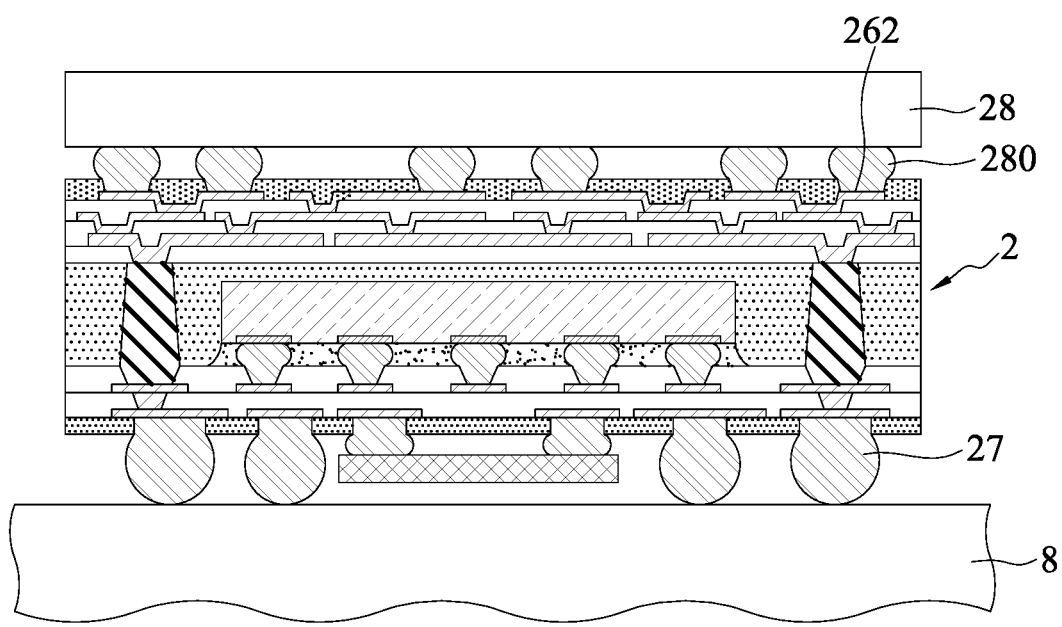
FIG. 2G is a schematic cross-sectional view of an application of FIG. 2F.

In an embodiment, the second circuit structure 26 is coreless, which includes a plurality of dielectric layers 260 and a plurality of fan out redistribution layers (FORDL) 261 disposed on the dielectric layer 260, wherein the outermost dielectric layer 260 can be used as a solder mask layer, so that the outermost redistribution layer 261 is partially exposed from the solder mask layer for use as an electrical contact pad 262, so that a package module 28 such as a double data rate (DDR) synchronous dynamic random access memory structure can be attached on and electrically connected to the second circuit structure 26 by a solder material 280 later (as shown in FIG. 2G), wherein the ground layer 24 is disposed on one layer of a plurality of redistribution layers 261, such as any inner layer (i.e., not the outermost layer). For example, the material for forming the redistribution layer 261 is copper, and the material for forming the dielectric layer 260 is a dielectric material such as polybenzoxazole (PBO), polyimide (PI), prepreg (PP) and the like.

Figure 3A:
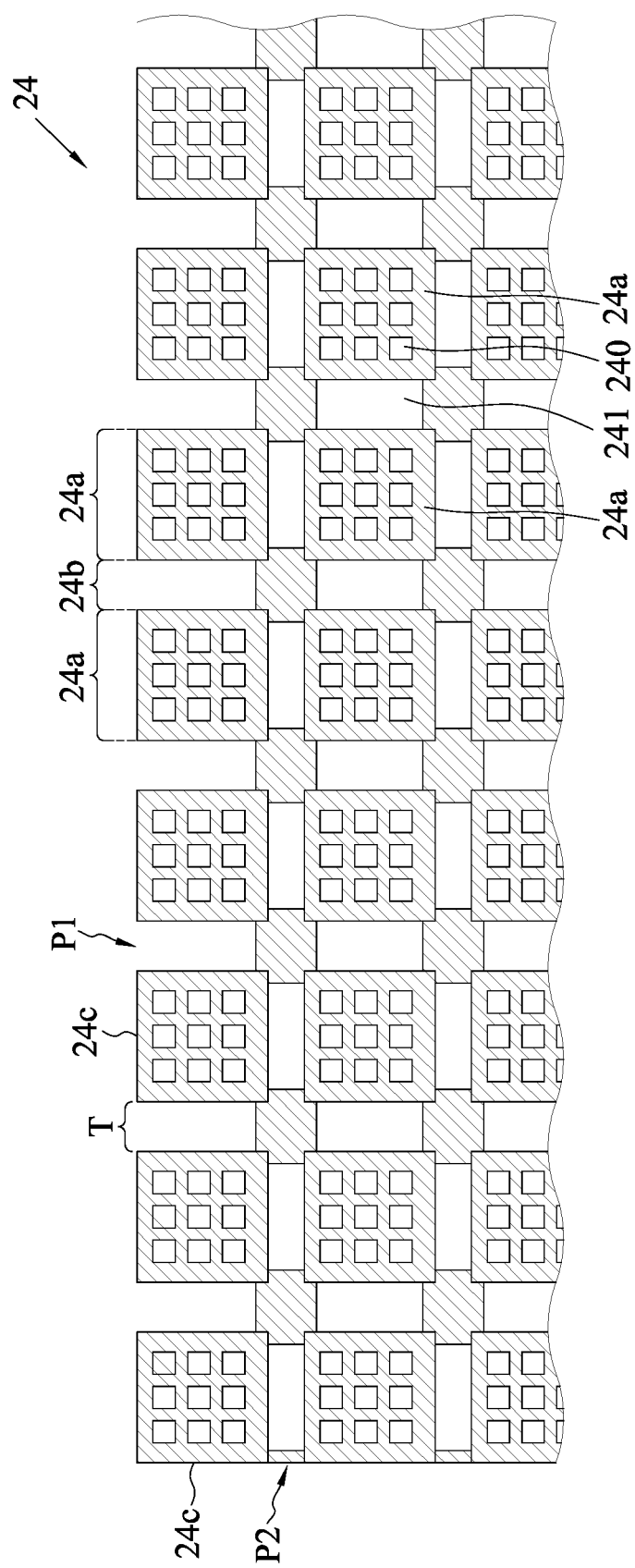
FIG. 3A is a schematic partial top view of FIG. 2C.

Furthermore, the pattern design of the ground layer 24 is a regular arrangement. As shown in FIG. 3A, the ground layer 24 includes a plurality of rectangular (such as square) sheet bodies 24a (such as the length and width of 200×200 micrometers [μm]) arranged in a matrix, so that the overall pattern area of the ground layer 24 is a rectangular outline area, and the two adjacent sheet bodies 24a are connected by a connecting section 24b (it is a rectangular area), wherein the connecting section 24b is formed with at least one slot 241, and at least one hole 240 is formed on the sheet body 24a. For example, a plurality (such as nine) of holes 240 arranged in an array (such as three rows and three columns) are formed on the sheet body 24a, and the holes 240 may be rectangular, circular or other shapes, wherein the slot 241 at the edge of the pattern of the ground layer 24 may have an opening T connected to the outer edge 24c of the ground layer 24 and be open (such as an upper edge P1 as shown in FIG. 3A) or closed without being connected to the outer edge 24c of the ground layer 24 (such as a left edge P2 as shown in FIG. 3A).

Figure 3B:
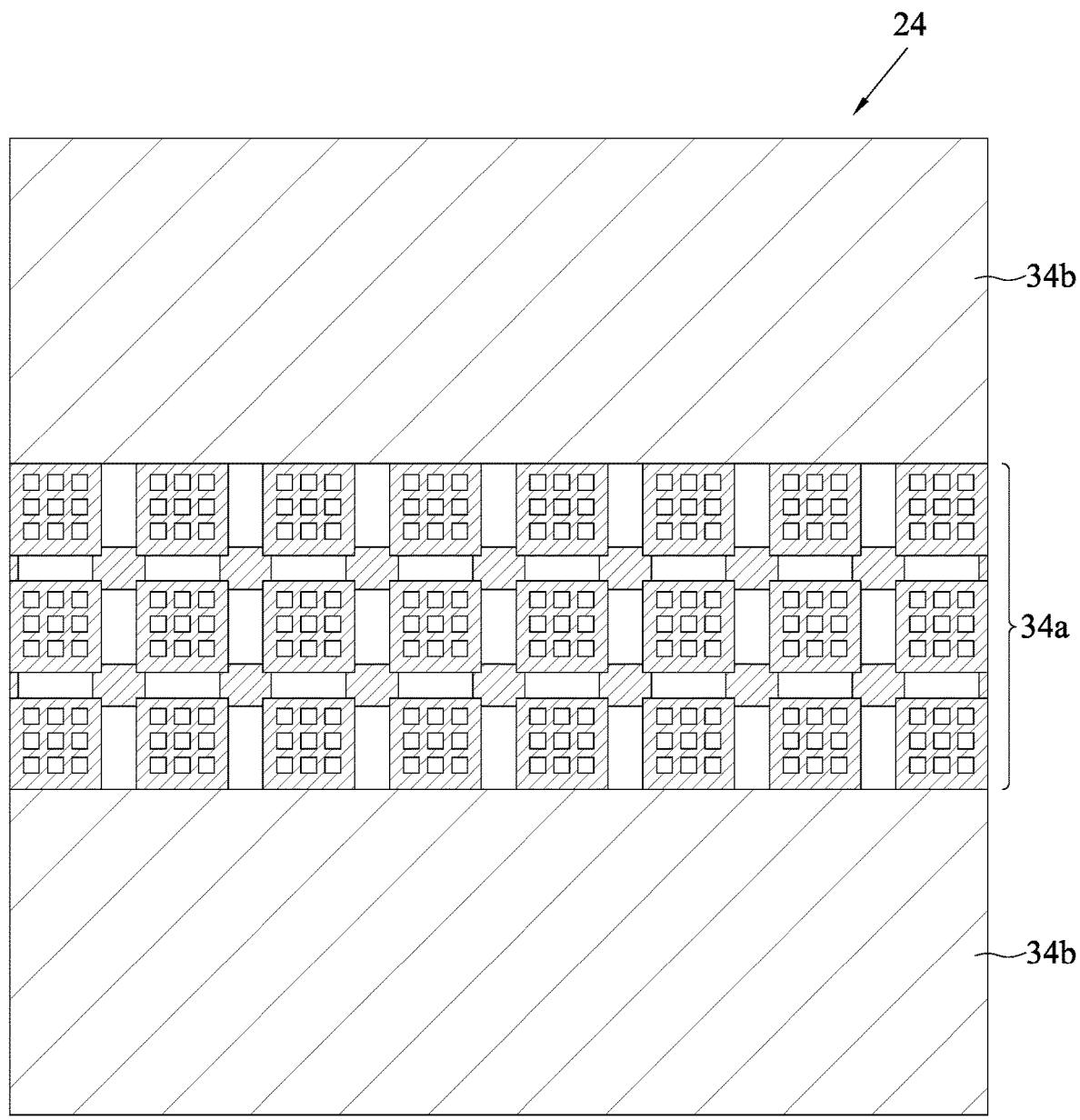
FIG. 3B is a schematic top view of another aspect of FIG. 2C.

It should be understood that the ground layer 24 can form the above-mentioned patterned copper surface on the entire surface of the whole dielectric layer 260, or can also form the above-mentioned patterned copper surface 34a on a partial surface of the whole dielectric layer 260 as required, such as the central ⅓ area as shown in FIG. 3B, and the remaining upper and lower ⅓ areas are designed as a single sheet (i.e., not patterned) copper surface 34b. Therefore, the present disclosure does not specifically limit the patterned layout area of the ground layer 24.

Figure 4A:
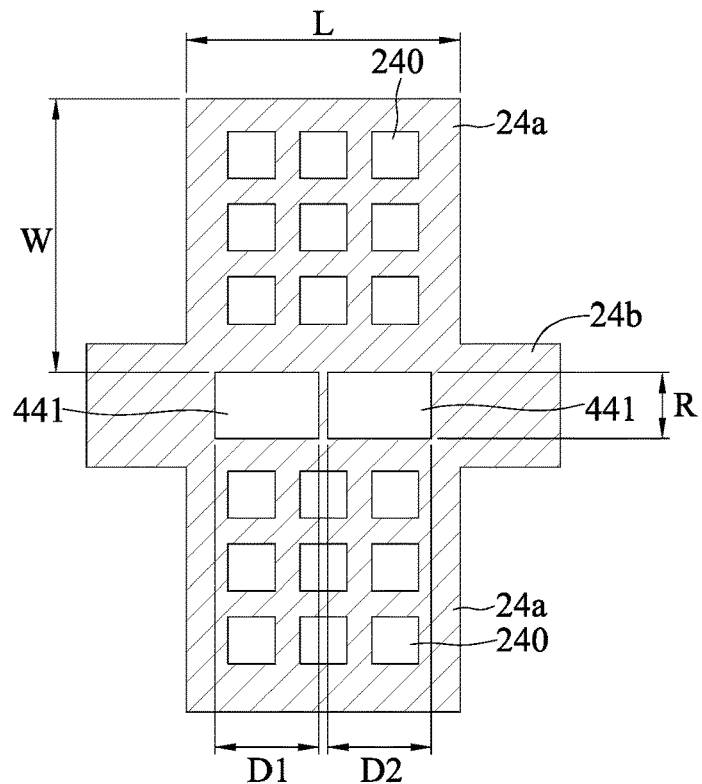
FIGS. 4A to 4C are schematic top plan views of other aspects of FIG. 3A.
Figure 4B:
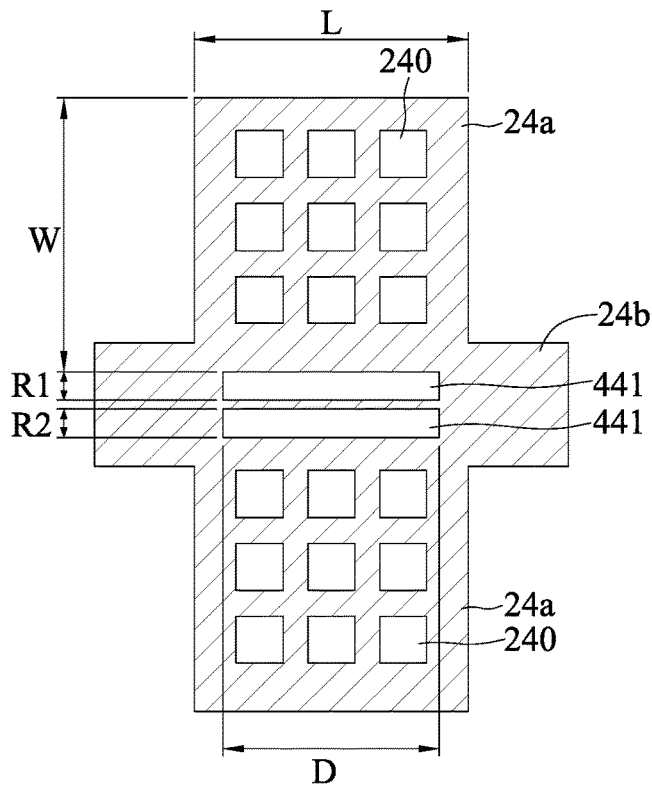
Figure 4C:
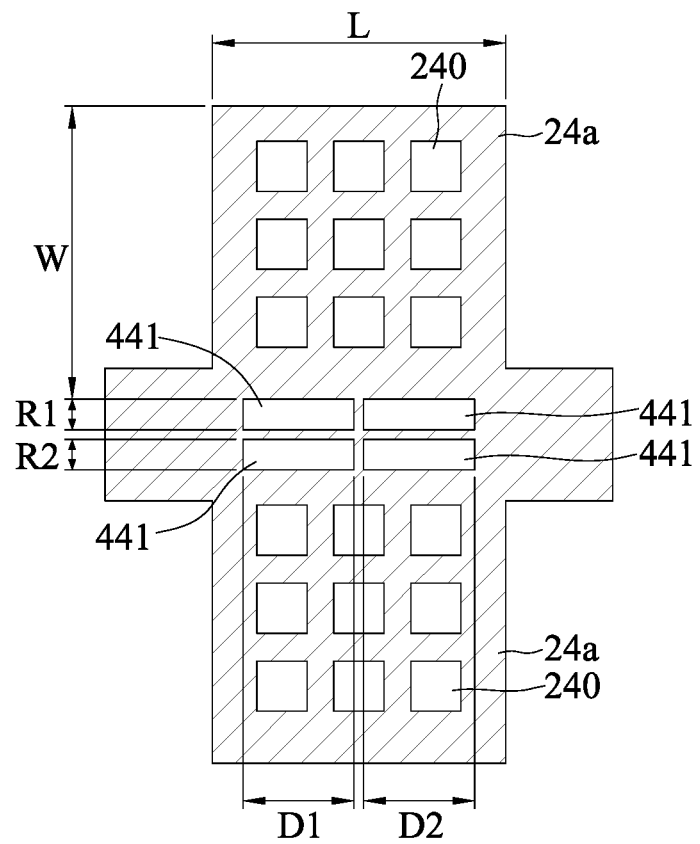

In addition, the connecting section 24b connects the adjacent corners of the plurality of sheet bodies 24a, so that a slot 241 is formed between the opposite sides of the edge of the sheet body 24a, so that the slot 241 is disposed at a position corresponding to a central position of the edge of each of the sheet bodies 24a. In other embodiments, a plurality of slots 441 arranged in an array can be disposed between two adjacent sheet bodies 24a, as shown in FIG. 4A to FIG. 4C, so that the slots 441 can be arranged at intervals along the length direction (as shown in FIG. 4A), the width direction (as shown in FIG. 4B) or the above two directions (as shown in FIG. 4C) of the connecting section 24b (or the rectangular area) between the two sheet bodies 24a.

In addition, the total length D, (D1+D2) of the slot 241, 441 on a single connecting section 24b accounts for at least 60% or more (such as 60-95%, preferably between 80-95%) of a side length L (i.e., the side length in the length direction) of the corresponding edge of the sheet body 24a parallel to the length of the slot 241, 441, and the total width R, (R1+R2) of the slot 241, 441 on a single connecting section 24b accounts for at least 1% or more (such as 1-10%, preferably between 5-10%) of a side length W (i.e., the side length in the width direction) of the corresponding edge of the sheet body 24a parallel to the width of the slot 241, 441, and the total area B of all the holes 240 on a single sheet body 24a accounts for at least 10% or more (such as 10-40%, preferably between 10-30%) of the area A (i.e., $A = L \times W$) of a vertical projection of the four side contours of the sheet body 24a. For example, the square of the sheet body 24a has a side length of 10 units, its area A is $10 \times 10 = 100$ square units, the square hole 240 has a side length of 2 units, and its total area B is $9 \times (2 \times 2) = 36$ square units, so $B/A = 36/100 = 0.36 = 36\%$.

It should be understood that one of the redistribution layers 201 of the first circuit structure 20 can also be designed as the above-mentioned ground layer 24.

As shown in FIG. 2D, the carrier board 9 and the release layer 90 and the adhesive layer 91 thereon are removed to expose the first circuit structure 20.

As shown in FIG. 2E, a plurality of conductive elements 27 such as solder balls are formed on the redistribution layer 201 on the exposed side of the first circuit structure 20, so that the plurality of conductive elements 27 are electrically connected to the conductive pillars 23 and/or the electronic element 21.

In an embodiment, an insulating protective layer 203 such as a solder mask layer can be formed on the dielectric layer 200, and a plurality of holes are formed on the insulating protective layer 203, so that the redistribution layer 201 exposes the holes for bonding the conductive elements 27.

Furthermore, at least one auxiliary functional element 29, such as a passive element, can be attached to the exposed redistribution layer 201 of the first circuit structure 20.

As shown in FIG. 2F, a singulation process is performed along a cutting path S shown in the figure to obtain the electronic package 2, and in the subsequent process, as shown in FIG. 2G, the electronic package 2 can be attached onto an electronic device 8 such as a circuit board by means of the conductive elements 27.

Therefore, in the manufacturing method of the present disclosure, the first circuit structure 20 and the second circuit structure 26 are mainly fabricated by using the fan-out redistribution layer (FORDL) 201, 261 to replace the conventional package substrate with a core layer. Therefore, the electronic package 2 of the present disclosure can effectively reduce the overall package height.

Furthermore, an initial full-surface copper sheet of the ground layer 24 is cut into a plurality of sheet bodies 24a arranged in a matrix, and partially connected by connecting sections 24b, so that at least one slot 241, 441 is formed between the two adjacent sheet bodies 24a to improve the flexibility of the overall circuit structure. Therefore, compared with the prior art, the electronic package 2 of the present disclosure can have better warpage control performance, thereby improving the bonding yield of the package module 28 on the second circuit structure 26.

In addition, the ratio of the total length D, (D1+D2) (or total width R, (R1+R2)) of the slot 241, 441 to the side length of the corresponding sheet body 24a can be adjusted according to the warpage condition of the matched package module 28, so that the warpage degrees of the electronic package 2 and the package module 28 can be matched with each other, so as to improve the bonding yield of the two. Similarly, the holes 240 disposed in the sheet body 24a can improve the flexibility of the circuit structure, so the distribution density (i.e., the area ratio) of the holes 240 can be adjusted according to the warpage condition of the package module 28, so that the warpage degrees of the electronic package 2 and the package module 28 can be matched with each other, so as to improve the bonding yield of the two.

In addition, the slot 241, 441 at the edge of the pattern of the ground layer 24 can be open or closed, and compared with the closed type, the flexibility of the open circuit structure is better. Therefore, the electronic package 2 can be an open type and/or a closed type according to the warpage condition of the package module 28, so that the warpage degrees of the electronic package 2 and the package module 28 can be matched with each other, so as to improve the bonding yield of the two.

Figure 5:
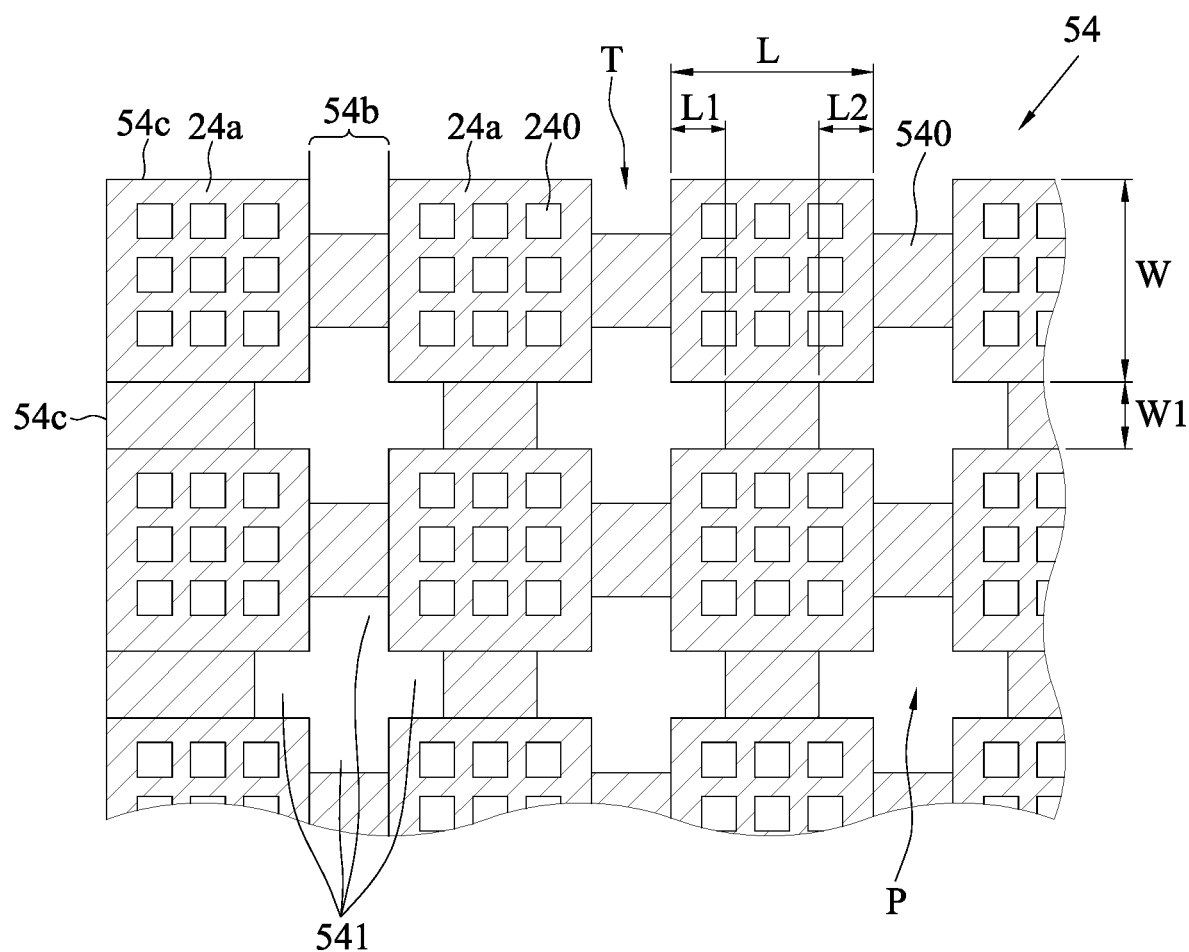
FIG. 5 is a schematic partial top view of the electronic package according to a second embodiment of the present disclosure.

FIG. 5 is a schematic partial top view of the electronic package according to a second embodiment of the present disclosure. The difference between this embodiment and the first embodiment lies in the pattern of the ground layer, and other manufacturing processes are substantially the same. Therefore, only the differences will be described below, and the similarities will not be repeated.

As shown in FIG. 5, the ground layer 54 includes a plurality of rectangular sheet bodies 24a arranged in a matrix, so that the overall pattern area of the ground layer 54 is a rectangular outline area, and the two adjacent sheet bodies 24a are connected by a connecting section 54b (it is a rectangular area), wherein the connecting section 54b is formed with slots 541 at the corresponding corners of the sheet body 24a, so that the slots 541 formed between the plurality of sheet bodies 24a are communicated with each other to form a cross-shaped slotted hole P at a position corresponding to a corner of each of the sheet bodies 24a, and at least one hole 240 is formed on the sheet body 24a.

Figure 6:
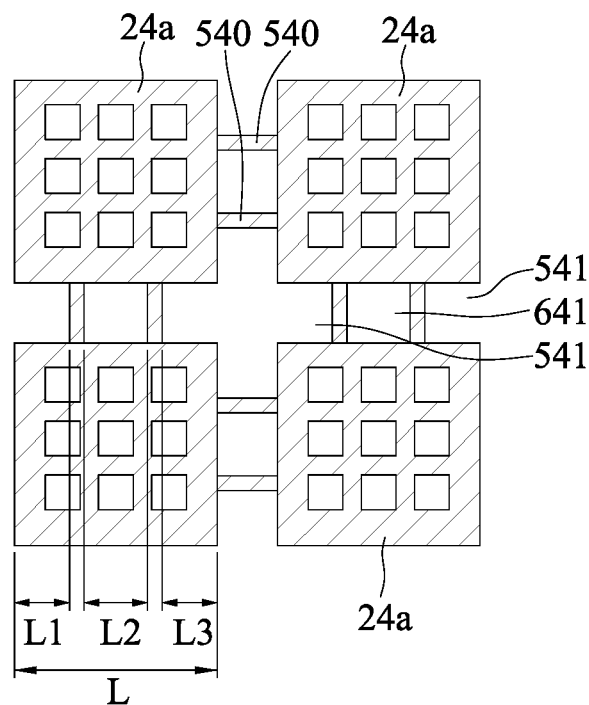
FIG. 6 is a schematic top plan view of another aspect of FIG. 5.

In another embodiment, the connecting section 54b may be in the form of at least one bridge trace 540, such as one shown in FIG. 5 or two shown in FIG. 6 or more, without special restrictions. For example, at least one slot 641 can be added at the central position of the connecting section 54b, as shown in FIG. 6, so that the connecting section 54b includes two bridge traces 540. Therefore, a slot 641 positioned corresponding to the central position of the edge of the sheet body 24a is provided between the adjacent cross-shaped slotted holes P. It can be understood that, if the connecting section 54b includes more than three bridge traces 540, a plurality of slots 641 arranged in an array and positioned corresponding to the central position of the edge of the sheet body 24a are provided between the adjacent cross-shaped slotted holes P (not shown, please refer to the configuration of the slots 441 in FIGS. 4A to 4C).

Furthermore, the holes 240 may be circular, rectangular or other shapes, and the slot 541 at the edge of the pattern of the ground layer 54 may have an opening T connected to the outer edge 54c of the ground layer 54 and is open (the upper edge as shown in FIG. 5) or closed (the left edge as shown in FIG. 5) without being connected to the outer edge 54c of the ground layer 54.

In addition, the ground layer 54 can form a patterned copper surface on the entire surface of the whole dielectric layer 260, and can also form a patterned copper surface on a partial surface of the whole dielectric layer 260 as required.

In addition, the total length (L1+L2), (L1+L2+L3) of the slot 541 on a single connecting section 54b accounts for at least 60% or more (such as 60-95%, preferably between 80-95%) of a side length L (i.e., the side length in the length direction) of the corresponding edge of the sheet body 24a parallel to the length of the slot 541, and the total width W1 of the slot 541 on a single connecting section 54b accounts for at least 1% or more (such as 1-10%, preferably between 5-10%) of a side length W (i.e., the side length in the width direction) of the corresponding edge of the sheet body 24a parallel to the width of the slot 541, and the total area B of all the holes 240 on a single sheet body 24a accounts for at least 10% or more (such as 10-40%, preferably between 10-30%) of the area A of a vertical projection of the four side contours of the sheet body 24a. For example, the square of the sheet body 24a has a side length of 10 units, its area A is 10×10=100 square units, the square hole 240 has a side length of 2 units, and its total area B is 9×(2×2)=36 square units, so B/A=36/100=0.36=36%.

It should be understood that one of the redistribution layers 201 of the first circuit structure 20 can also be designed as the above-mentioned ground layer 54.

Therefore, the design of the ground layer 54 of the embodiment is connecting a plurality of slots 541 to each other to form a cross-shaped slotted hole, so as to improve the flexibility of the overall circuit structure, but the structural flexibility of the pattern design of the ground layer 24 of the first embodiment is better than the structural flexibility of the pattern design of the ground layer 54 of the second embodiment.

FIGS. 7A to 7F are schematic views of the electronic package according to a third embodiment of the present disclosure. The difference between this embodiment and the above-mentioned embodiment lies in the number of layers of the ground layer, and other manufacturing processes are substantially the same. Therefore, only the differences will be described below, and the similarities will not be repeated.

Figure 7A:
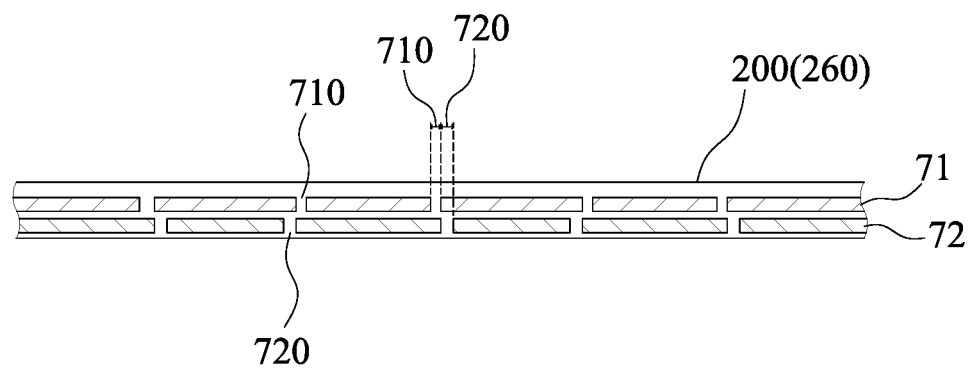
FIG. 7A is a schematic partial cross-sectional view of the electronic package according to a third embodiment of the present disclosure.
Figure 7B:
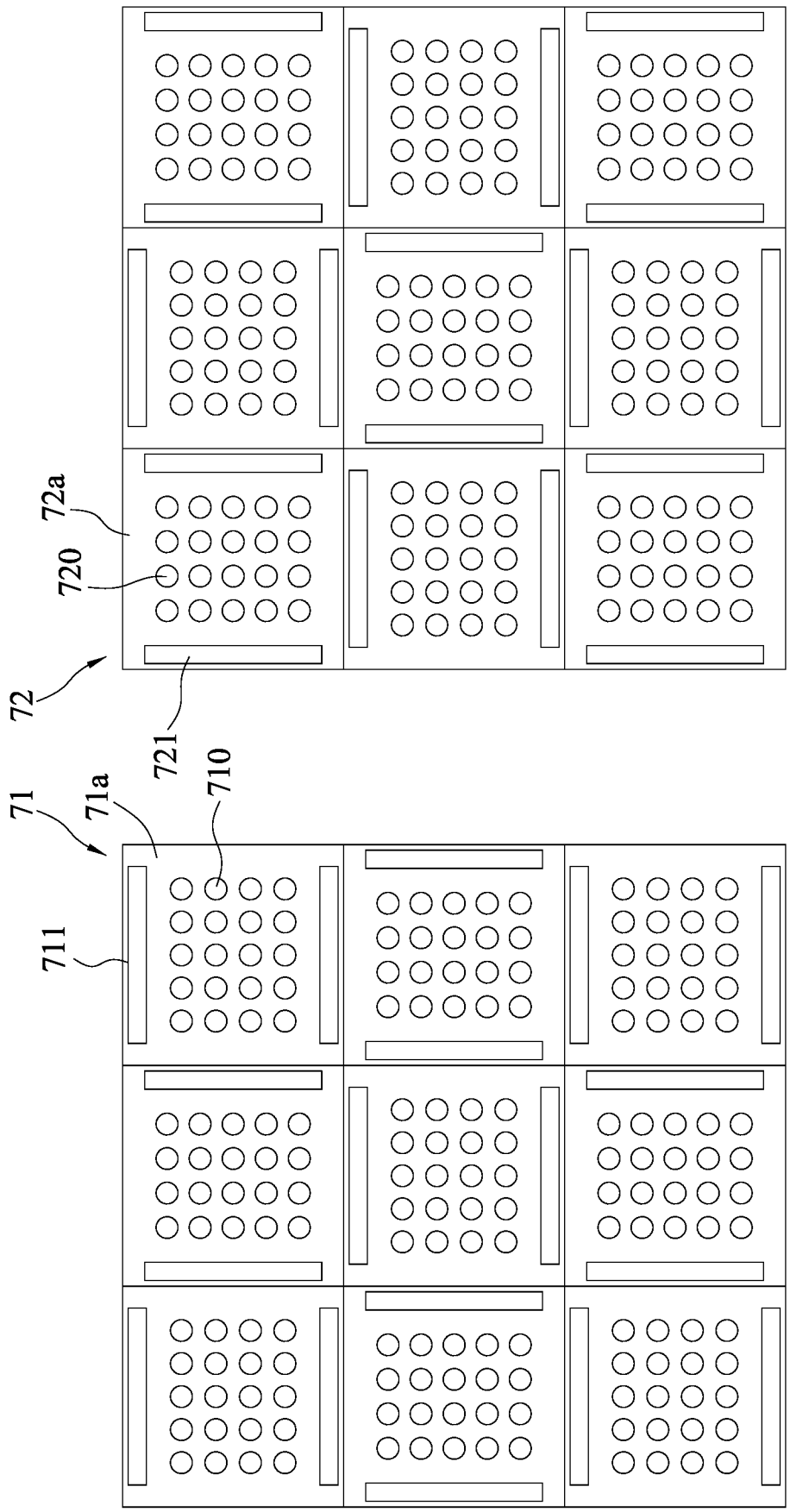
FIG. 7B is a schematic exploded top view of FIG. 7A.

As shown in FIGS. 7A and 7B, at least one of the first circuit structure 20 and the second circuit structure 26 in FIG. 2C is provided with two ground layers, which are defined as a first ground layer 71 and a second ground layer 72, the positions of the sheet bodies 71a, 72a of the first and second ground layers 71, 72 are vertically corresponding, and slots 711, 721 of the first and second ground layers 71, 72 are formed on the sheet bodies 71a, 72a.

Figure 7C:
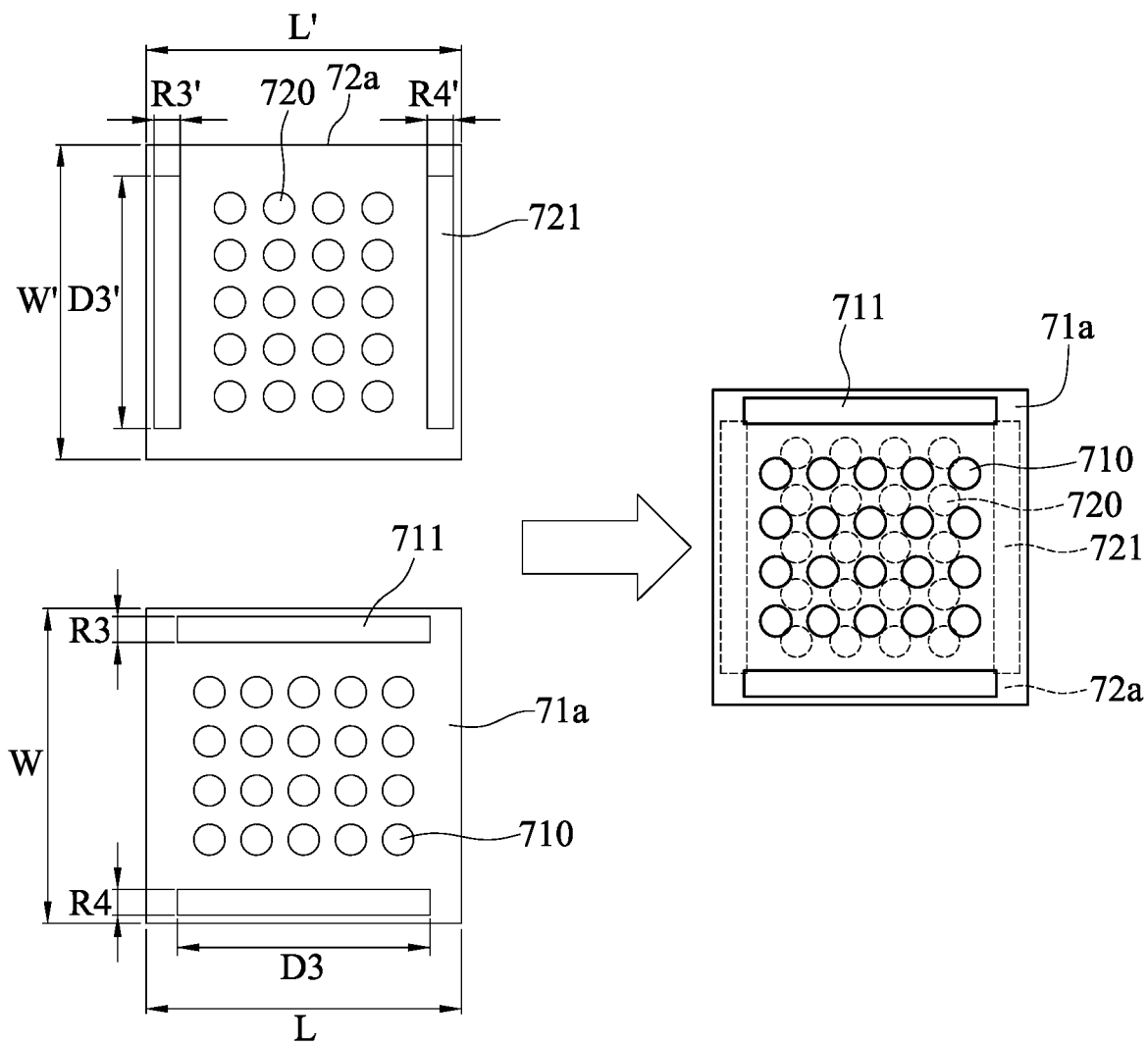
FIG. 7C is a schematic top view of a partial overlapping of FIG. 7B.

In an embodiment, as shown in FIG. 7C, the slots 711, 721 of the first and second ground layers 71, 72 do not overlap in the vertical direction. For example, the slots 711, 721 are formed on opposite edges of the sheet bodies 71a, 72a, and the slots 711, 721 do not extend to the corners of the sheet bodies 71a, 72a, so that when the slots 711 of the first ground layer 71 are formed at the lateral edges of the rectangle, the slots 721 of the second ground layer 72 are formed at the straight edges of the rectangle, and when the slots 711 of the first ground layer 71 are formed at the straight edges of the rectangle, the slots 721 of the second ground layer 72 are formed at the lateral edges of the rectangle.

Furthermore, the sheet bodies 71a, 72a of the first and second ground layers 71, 72 are formed with at least one circular hole 710, 720, so that the holes 710, 720 of the first and second ground layers 71, 72 also do not overlap in the vertical direction, as shown in FIG. 7A and FIG. 7C.

In addition, the total length D3, D3' of the slot 711, 721 accounts for at least 60% or more (such as 60-95%, preferably between 80-95%) of a side length L, W' (i.e., the side length in the length direction) of the corresponding edge of the sheet body 71a, 72a parallel to the length of the slot 711, 721, and the total width (R3+R4), (R3'+R4') of the slot 711, 721 accounts for at least 1% or more (such as 1-10%, preferably between 5-10%) of a side length W, L' (i.e., the side length in the width direction) of the corresponding edge of the sheet body 71a, 72a parallel to the width of the slot 711, 721, and the total area B of all the holes 710, 720 on a single sheet body 71a, 72a accounts for at least 10% or more (such as 10-40%, preferably between 10-30%) of the area A of a vertical projection of the four side contours of the sheet body 71a, 72a. For example, the square of the sheet body 71a, 72a has a side length of 10 units, its area A is 10×10=100 square units, the circular hole 710, 720 is 1 unit in diameter, and its total area B is 20×(0.5×0.5)π=5π square units, so B/A≈15.7/100≈0.16≈16%.

Therefore, the upper and lower slots 711, 721 are displaced from each other without overlapping, so that the first and second ground layers 71, 72 present a pattern of full metal coverage without holes in the vertical direction, such that the grounding and shielding effects of the first and second ground layers 71 and 72 are better than the grounding and shielding effects of the first and second embodiments.

Figure 7D:
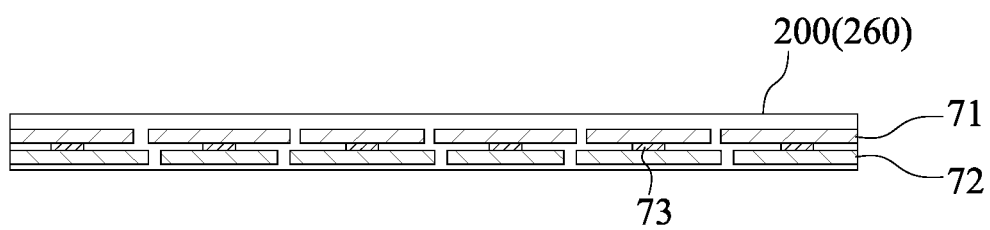
FIG. 7D is a schematic partial top view of another aspect of FIG. 7A.
Figure 7E:
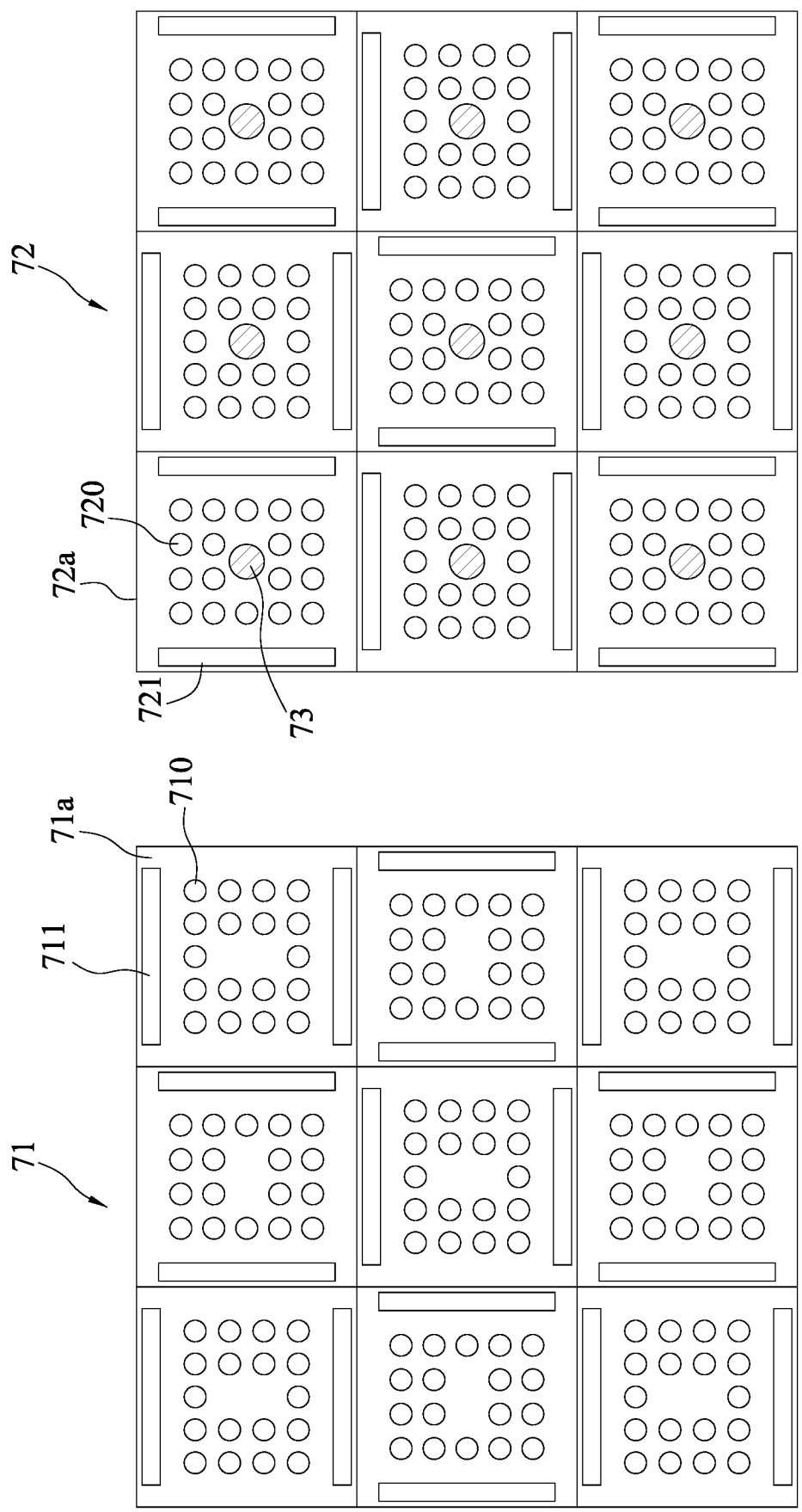
FIG. 7E is a schematic exploded top view of FIG. 7D.
Figure 7F:
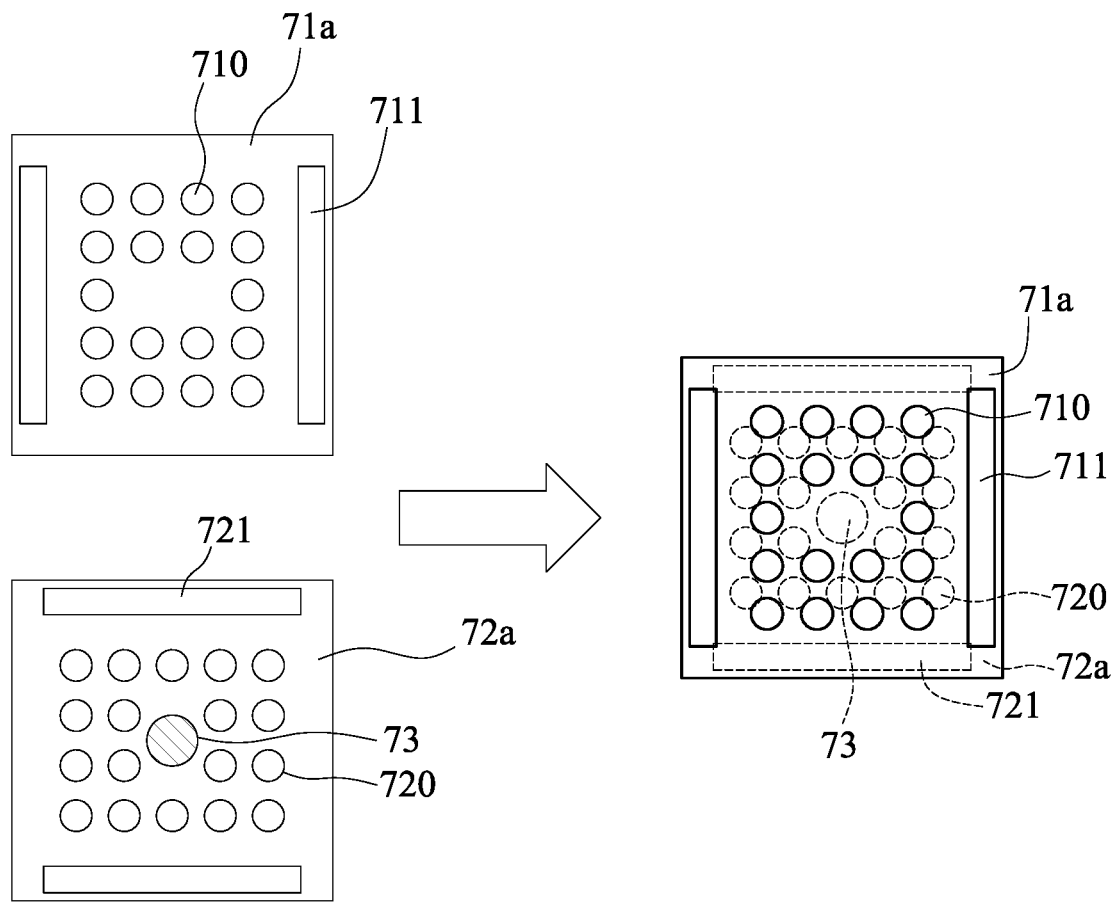
FIG. 7F is a schematic top view of a partial overlapping of FIG. 7E.

Furthermore, there is no redistribution layer 201, 261 between the first and second ground layers 71, 72, so a plurality of conductors 73 can be disposed between the first and second ground layers 71, 72 corresponding to the plurality of sheet bodies 71a, 72a, respectively, such as metal cylinders (such as copper pillars) as shown in FIG. 7D to FIG. 7F, and the sheet bodies 71a and 72a of the first and second ground layers 71 and 72 are electrically connected by at least one of the plurality of conductors 73. For example, the conductor 73 is located in the middle of the sheet body 71a, 72a.

Therefore, the upper and lower sheet bodies 71a and 72a are electrically connected to each other by the conductor 73, so that the ground transmission distance is shortened, so as to reduce the signal delay and make the electrical performance better.

FIGS. 8A to 8D are schematic partial top views of the electronic package according to a fourth embodiment of the present disclosure. The difference between this embodiment and the third embodiment lies in the dislocation of the upper and lower slots, and other manufacturing processes are substantially the same. Therefore, only the differences will be described below, and the similarities will not be repeated.

Figure 8A:
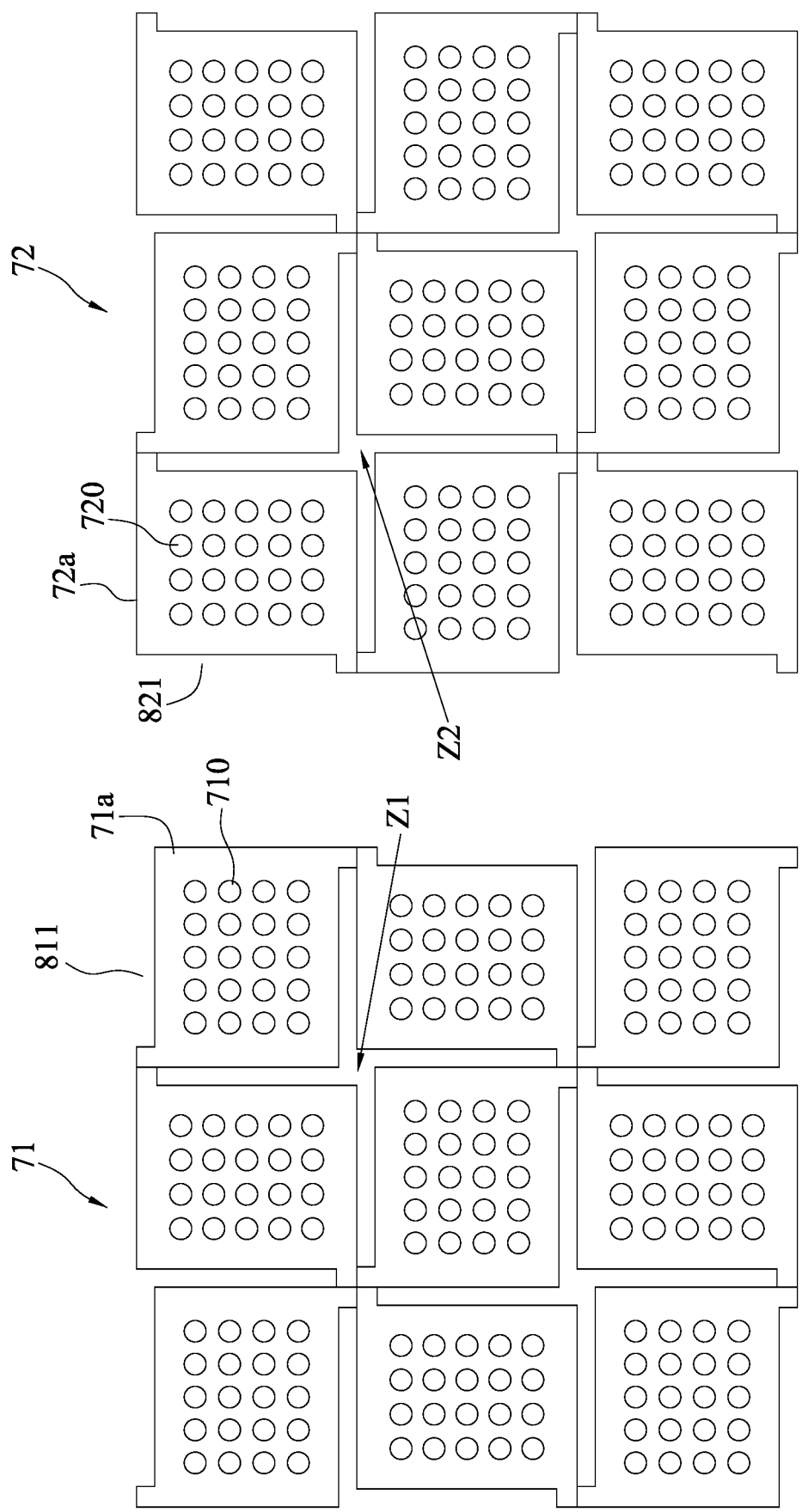
FIG. 8A is a schematic partial exploded top view of the electronic package according to a fourth embodiment of the present disclosure.
Figure 8B:
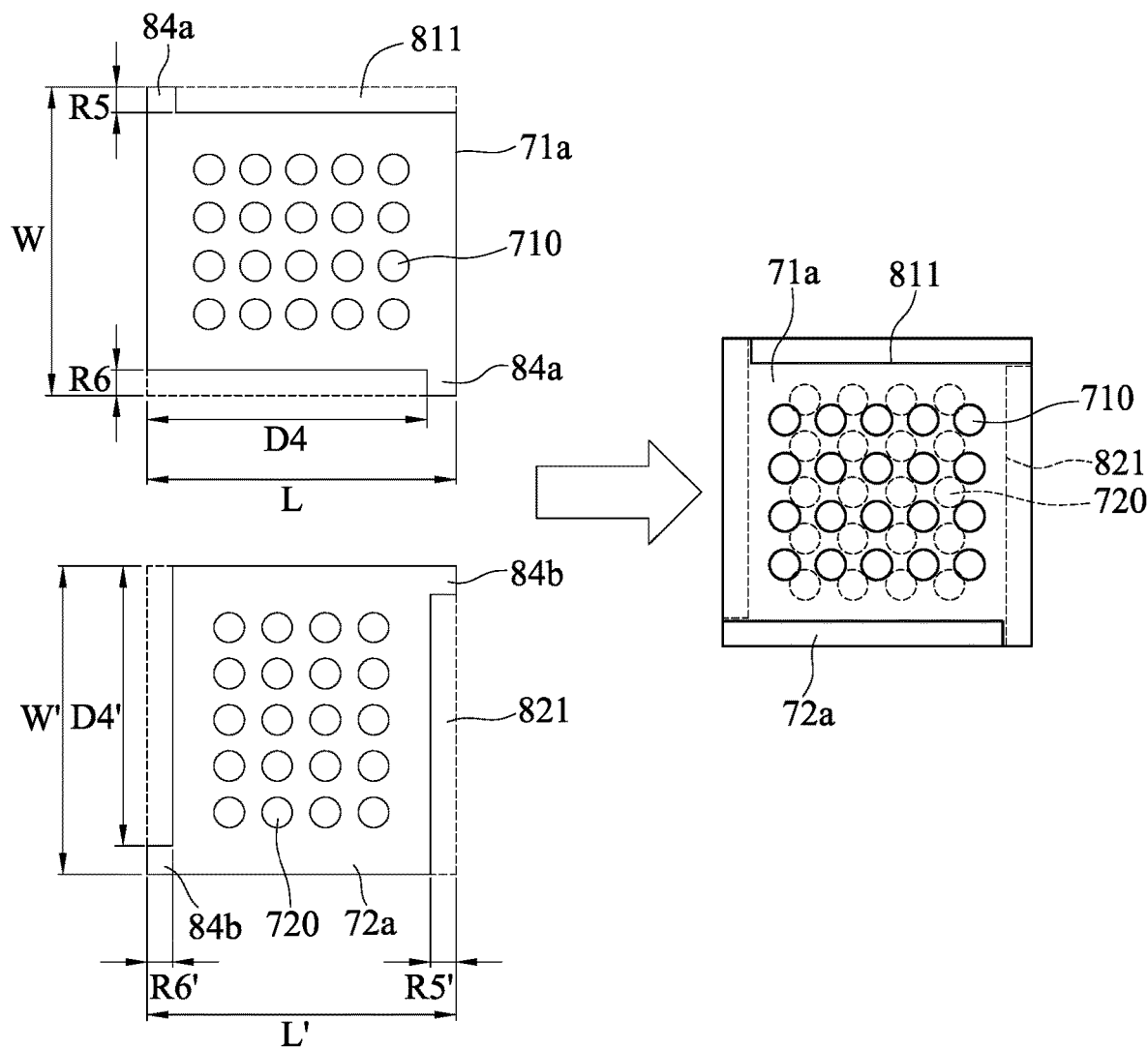
FIG. 8B is a schematic top view of a partial overlapping of FIG. 8A.

As shown in FIG. 8A and FIG. 8B, the slots 811, 821 extend to the corners of the sheet bodies 71a, 72a, and the two slots 811, 821 on the same sheet body 71a, 72a extend to the corners in different directions, and the slots 811, 821 extend to the edges of the sheet bodies 71a, 72a to form connecting sections 84a, 84b at diagonal corners of each of the sheet bodies 71a, 72a of the first and second ground layers 71, 72.

In an embodiment, the plurality of slots 811, 821 formed between the plurality of sheet bodies 71a, 72a are connected to each other to form a cross-shaped slotted hole Z1, Z2 at a position corresponding to a corner of each of the sheet bodies 71a, 72a.

In addition, the total length D4, D4' of the slot 811, 821 accounts for at least 60% or more (such as 60-95%, preferably between 80-95%) of a side length L, W' (i.e., the side length in the length direction) of the corresponding edge of the sheet body 71a, 72a parallel to the length of the slot 811, 821, and the total width (R5+R6), (R5'+R6') of the slot 811, 821 accounts for at least 1% or more (such as 1-10%, preferably between 5-10%) of a side length W, L' (i.e., the side length in the width direction) of the corresponding edge of the sheet body 71a, 72a parallel to the width of the slot 811, 821, and the total area B of all the holes 710, 720 on a single sheet body 71a, 72a accounts for at least 10% or more (such as 10-40%, preferably between 10-30%) of the area A of a vertical projection of the four side contours of the sheet body 71a, 72a. For example, the square of the sheet body 71a, 72a has a side length of 10 units, its area A is 10×10=100 square units, the circular hole 710, 720 is 1 unit in diameter, and its total area B is 20×(0.5×0.5)π=5π square units, so B/A≈15.7/100≈0.16≈16%.

Therefore, the upper and lower slots 811, 821 are displaced from each other without overlapping, so that the first and second ground layers 71, 72 present a pattern of full metal coverage without holes in the vertical direction, such that the grounding and shielding effects of the first and second ground layers 71 and 72 are better than the grounding and shielding effects of the first and second embodiments.

Figure 8C:
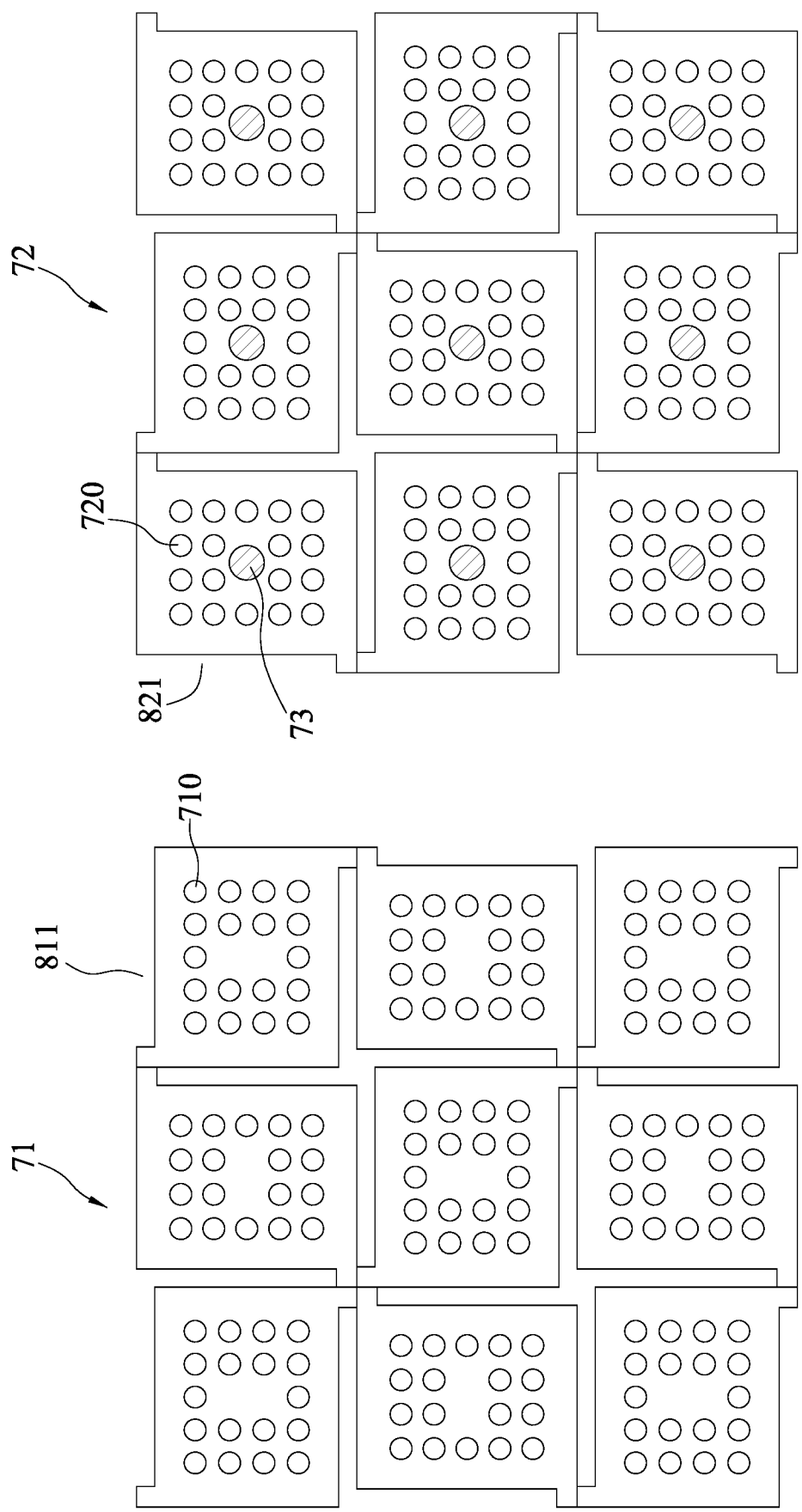
FIG. 8C is a schematic partial exploded top view of another aspect of FIG. 8A.
Figure 8D:
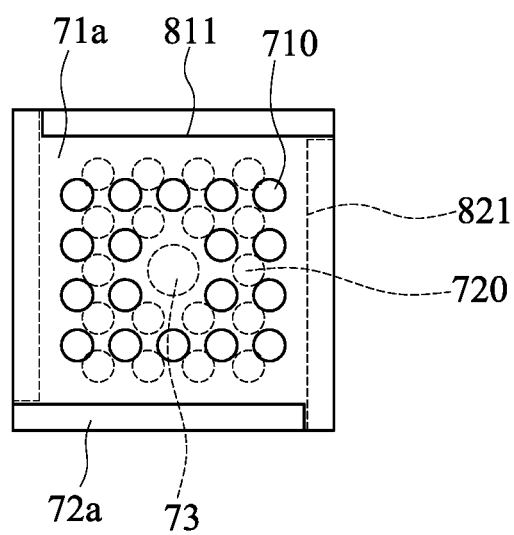
FIG. 8D is a schematic top view of a partial overlapping of FIG. 8C.

Furthermore, a plurality of conductors 73 can also be disposed between the first and second ground layers 71, 72 corresponding to the plurality of sheet bodies 71a, 72a, respectively, as shown in FIG. 8C and FIG. 8D, so that the sheet bodies 71a and 72a of the first and second ground layers 71 and 72 are electrically connected to each other by at least one of the plurality of conductors 73, so as to shorten the ground transmission distance and reduce the signal delay, thereby improving the electrical performance.

FIGS. 9A to 9D are schematic partial top views of the electronic package according to a fifth embodiment of the present disclosure. The difference between this embodiment and the above-mentioned embodiment lies in the design of the slot, and other manufacturing processes are substantially the same. Therefore, only the differences will be described below, and the similarities will not be repeated.

Figure 9A:
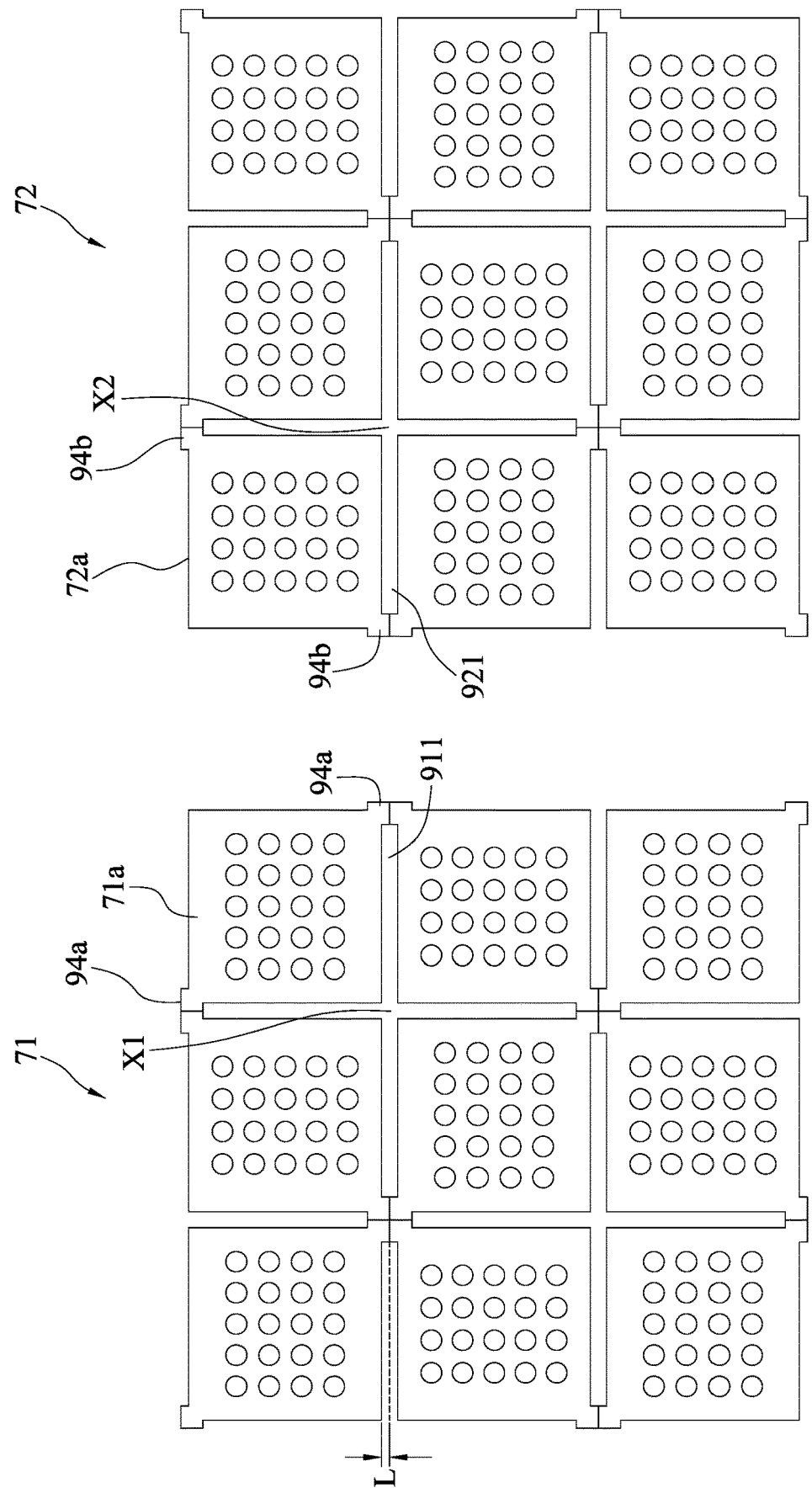
FIG. 9A is a schematic partial exploded top view of the electronic package according to a fifth embodiment of the present disclosure.
Figure 9B:
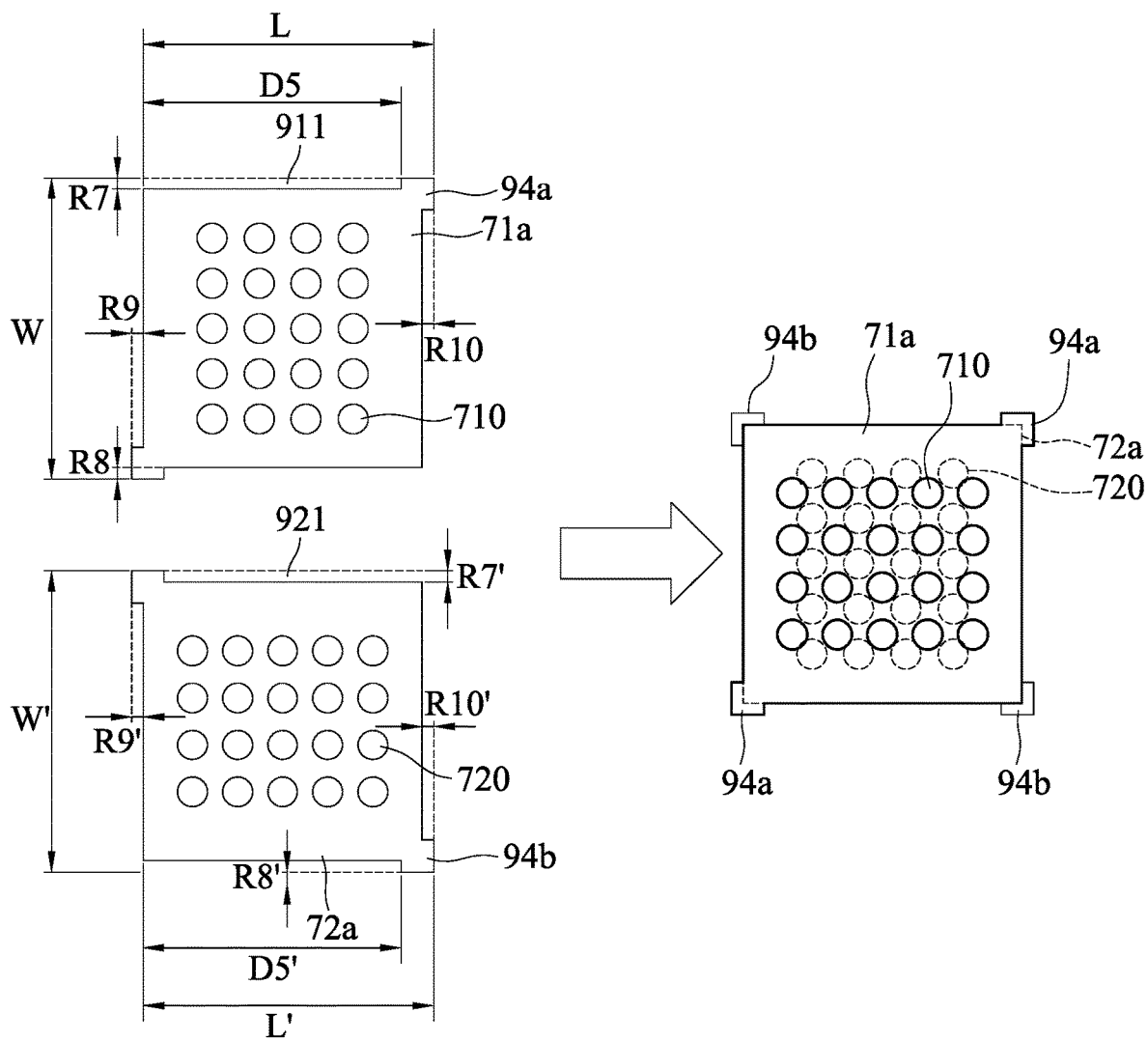
FIG. 9B is a schematic top view of a partial overlapping of FIG. 9A.

As shown in FIG. 9A and FIG. 9B, based on the aspect shown in FIG. 3A, connecting sections 94a, 94b are formed at diagonal corners of each of the sheet bodies 71a, 72a of the first and second ground layers 71, 72 to connect the four sheet bodies 71a, 72a of the same layer, so that a plurality of slots 911, 921 formed between the four sheet bodies 71a, 72a of the same layer communicate with each other to form a large-area cross-shaped slotted hole X1, X2 at a position corresponding to a corner of each of the sheet bodies 71a, 72a. In other words, the connecting sections 94a, 94b can be formed by removing partial materials from each side length L, W, W of the sheet body 71a, 72a, and the removed portions of the sheet body 71a, 72a will form the slots 911, 921.

Figure 9C:
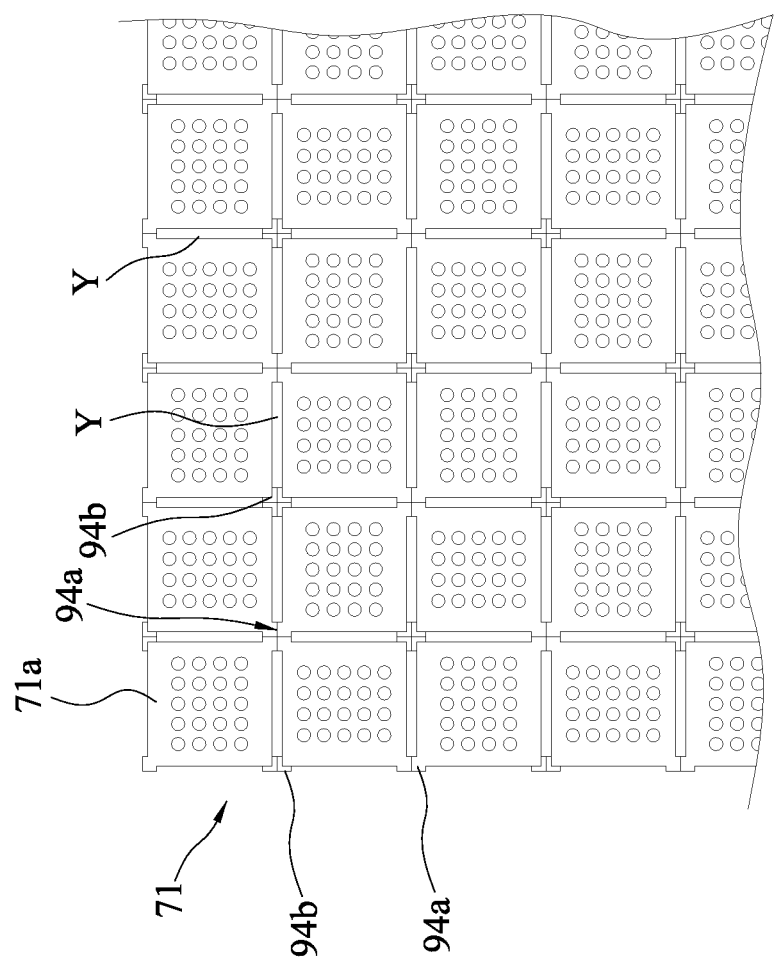
FIG. 9C is a schematic top view of an overlapping of FIG. 9A.

In an embodiment, a central intersection of the cross-shaped slotted hole X1 of the first ground layer 71 correspondingly overlaps the four connected connecting sections 94b of the second ground layer 72, and a central intersection of the cross-shaped slotted hole X2 of the second ground layer 72 also correspondingly overlaps the four connected connecting sections 94a of the first ground layer 71, so the pattern of the first and second ground layers 71 and 72 arranged in an overlapping arrangement presents a linear slotted hole Y in the vertical direction, as shown in FIG. 9C.

Therefore, through the design of the cross-shaped slotted hole X1, X2, the extension areas of the slots 911, 921 of the first and second ground layers 71, 72 are enlarged, so as to strengthen the flexibility of the first and second ground layers 71, 72.

Figure 9D:
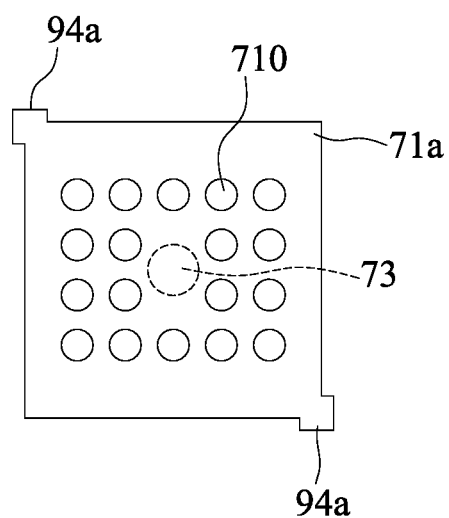
FIG. 9D is a schematic partial top view of another aspect of FIG. 9A.

Furthermore, a plurality of conductors 73 can also be disposed between the first and second ground layers 71, 72 corresponding to the plurality of sheet bodies 71a, 72a, respectively, as shown in FIG. 9D, so that the sheet bodies 71a and 72a of the first and second ground layers 71 and 72 are electrically connected to each other by at least one of the plurality of conductors 73, so as to shorten the ground transmission distance and reduce the signal delay, thereby improving the electrical performance.

In an embodiment, the total length D5, D5' of the slot 911, 921 accounts for at least 60% or more (such as 60-95%, preferably between 80-95%) of a side length L, W, W of the corresponding edge of the sheet body 71a, 72a parallel to the length of the slot 911, 921, and the total width (R7+R8), (R9+R10), (R7'+R8'), (R9'+R10') of the slot 911, 921 accounts for at least 1% or more (such as 1-10%, preferably between 5-10%) of a side length W, L, W', L' (i.e., the side length in the width direction) of the corresponding edge of the sheet body 71a, 72a parallel to the width of the slot 911, 921, and the total area B of all the holes 710, 720 on a single sheet body 71a, 72a accounts for at least 10% or more (such as 10-40%, preferably between 10-30%) of the area A of a vertical projection of the four side contours of the sheet body 71a, 72a. For example, the square of the sheet body 71a, 72a has a side length of 10 units, its area A is 10×10=100 square units, the circular hole 710, 720 is 1 unit in diameter, and its total area B is 20×(0.5×0.5)π=5π square units, so B/A≈15.7/100≈0.16≈16%.

The present disclosure also provides an electronic package 2, comprising: a cladding layer 25, a first circuit structure 20, a second circuit structure 26, a plurality of conductive pillars 23, at least one electronic element 21, and at least one ground layer 24, 54 (a first ground layer 71 and a second ground layer 72).

The cladding layer 25 has a first surface 25a and a second surface 25b opposite to each other.

The first circuit structure 20 is disposed on the first surface 25a of the cladding layer 25.

The second circuit structure 26 is disposed on the second surface 25b of the cladding layer 25, wherein the fan-out redistribution layers 201, 261 are arranged in the first circuit structure 20 and the second circuit structure 26.

The conductive pillars 23 are embedded in the cladding layer 25 and electrically connected the first circuit structure 20 and the second circuit structure 26.

The electronic element 21 is disposed on the first circuit structure 20, embedded in the cladding layer 25 and electrically connected to the first circuit structure 20 or the second circuit structure 26.

The ground layers 24, 54 (the first ground layer 71 and the second ground layer 72) are disposed in at least one of the first circuit structure 20 and the second circuit structure 26, wherein the at least one ground layer 24, 54 (the first ground layer 71 and the second ground layer 72) includes a plurality of sheet bodies 24a, 71a, 72a arranged in an array, and at least one slot 241, 441, 541, 641, 711, 721, 811, 821, 911, 921 is disposed between every two adjacent sheet bodies 24a, 71a, 72a.

In one embodiment, at least one of the first circuit structure 20 and the second circuit structure 26 is provided with a first ground layer 71 and a second ground layer 72, and the positions of the sheet bodies 71a and 72a of the first ground layer 71 and the second ground layer 72 are vertically corresponding, and the slots 711, 721, 811, 821, 911, 921 of the first ground layer 71 and the second ground layer 72 do not overlap in the vertical direction. Further, it also includes a plurality of conductors 73 respectively corresponding to the plurality of sheet bodies 71a and 72a and disposed between the first ground layer 71 and the second ground layer 72, and the sheet bodies 71a, 72a of the first ground layer 71 and the second ground layer 72 are electrically connected by at least one of the plurality of conductors 73.

In one embodiment, at least one hole 240, 710, 720 is formed on each of the sheet bodies 24a, 71a, 72a. For example, at least one of the first circuit structure 20 and the second circuit structure 26 is provided with the first ground layer 71 and the second ground layer 72, and the positions of the sheet bodies 71a and 72a of the first ground layer 71 and the second ground layer 72 are vertically corresponding, so that the holes 710 and 720 of the first ground layer 71 and the second ground layer 72 do not overlap in the vertical direction. Or, the total area B of all the holes 240, 710, 720 on the sheet body 24a, 71a, 72a accounts for at least 10% of the area A of the vertical projection of the outer contour of the sheet body 24a, 71a, 72a (such as 10-40%, preferably between 10-30%).

In one embodiment, the at least one slot 241, 711, 721 is disposed at a central position corresponding to the edge of each of the sheet bodies 24a, 71a, 72a.

In one embodiment, a plurality of slots 441 arranged in an array are disposed between adjacent two of the plurality of sheet bodies 24a.

In one embodiment, the plurality of slots 541, 911, 921 formed between the plurality of sheet bodies 24a, 71a, 72a communicate with each other to form a cross-shaped slotted hole P, Z1, Z2, X1, X2 at a position corresponding to a corner of each of the sheet bodies 24a, 71a, 72a. Further, at least one slot 541, 641 arranged in an array is disposed between the adjacent cross-shaped slotted holes P and positioned corresponding to the central position of the edge of the sheet body 24a.

In one embodiment, the plurality of sheet bodies 24a, 71a, 72a are rectangular, and the total length D, (D1+D2), D3, D3', D4, D4', D5, D5', (L1+L2), (L1+L2+L3) of the at least one slot 241, 441, 541, 641, 711, 721, 811, 821, 911, 921 accounts for at least 60% or more of the side length L, L', W, W' of the corresponding edge of each of the sheet bodies 24a, 71a, 72a parallel to the length of the at least one slot 241, 441, 541, 641, 711, 721, 811, 821, 911, 921.

In one embodiment, the plurality of sheet bodies 24a, 71a, 72a are rectangular, and the total width R, (R1+R2), (R3+R4), (R3'+R4'), (R5+R6), (R5'+R6'), (R7+R8), (R7'+R8'), (R9+R10), (R9'+R10'), W1 of the at least one slot 241, 441, 541, 641, 711, 721, 811, 821, 911, 921 accounts for at least 1% or more of the side length L, L', W, W' of the corresponding edge of the sheet bodies 24a, 71a, 72a parallel to the width of the at least one slot 241, 441, 541, 641, 711, 721, 811, 821, 911, 921.

To sum up, in the electronic package of the present disclosure and the manufacturing method thereof, the first circuit structure and the second circuit structure are fabricated by using a fan-out redistribution layer to replace the conventional package substrate with a core layer. Therefore, the electronic package of the present disclosure can effectively reduce the overall package height.

Furthermore, the flexibility of the overall circuit structure is improved by the design of the sheet body, the hole and the slot of the ground layer, so the electronic package of the present disclosure can have better warpage control performance, so as to improve the bonding yield of the package module disposed on the second circuit structure.

The foregoing embodiments are provided for the purpose of illustrating the principles and effects of the present disclosure, rather than limiting the present disclosure. Anyone skilled in the art can modify and alter the above embodiments without departing from the spirit and scope of the present disclosure. Therefore, the scope of protection with regard to the present disclosure should be as defined in the accompanying claims listed below.

What is claimed is:

1. An electronic package, comprising:
a cladding layer with a first surface and a second surface opposite to each other;
a first circuit structure disposed on the first surface of the cladding layer and configured with a fan-out redistribution layer;
a second circuit structure disposed on the second surface of the cladding layer and configured with another fan-out redistribution layer;
a plurality of conductive pillars embedded in the cladding layer and electrically connected to the first circuit structure and the second circuit structure;
an electronic element disposed on the first circuit structure, embedded in the cladding layer and electrically connected to the first circuit structure or the second circuit structure; and
at least one ground layer disposed in at least one of the first circuit structure and the second circuit structure, wherein the at least one ground layer includes a plurality of sheet bodies arranged in an array, and at least one slot is disposed between any two adjacent ones of the sheet bodies.

2. The electronic package of claim 1, wherein at least one of the first circuit structure and the second circuit structure is provided with a plurality of the ground layers, and positions of the sheet bodies of any two adjacent ones of the ground layers are vertically corresponding to each other, and the slots between any two adjacent ones of the ground layers are free from overlapping in a vertical direction.

3. The electronic package of claim 2, further comprising a plurality of conductors respectively corresponding to the plurality of sheet bodies and disposed between any two adjacent ones of the ground layers, wherein the sheet bodies of the any two adjacent ones of the ground layers are electrically connected via at least one of the plurality of conductors.

4. The electronic package of claim 1, wherein each of the sheet bodies has at least one hole.

5. The electronic package of claim 4, wherein at least one of the first circuit structure and the second circuit structure is provided with a plurality of the ground layers, and positions of the sheet bodies of any two adjacent ones of the ground layers are vertically corresponding to each other, and the holes of the any two adjacent ones of the ground layers are free from overlapping in a vertical direction.

6. The electronic package of claim 4, wherein a total area of the at least one hole accounts for at least 10% or more of an area of a vertical projection of an outer contour of each of the sheet bodies.

7. The electronic package of claim 1, wherein the at least one slot is disposed at a position corresponding to a central position of an edge of each of the sheet bodies.

8. The electronic package of claim 1, wherein a plurality of slots arranged in an array are disposed between any two adjacent ones of the plurality of sheet bodies.

9. The electronic package of claim 1, wherein the plurality of slots formed between the plurality of sheet bodies are communicated with each other to form a cross-shaped slotted hole at a position corresponding to a corner of each of the sheet bodies.

10. The electronic package of claim 9, wherein a plurality of slots arranged in an array are disposed between the adjacent cross-shaped slotted holes and positioned corresponding to a central position of an edge of the sheet body.

11. The electronic package of claim 1, wherein the plurality of sheet bodies are rectangular, and a total length of the at least one slot accounts for at least 60% or more of a side length of a corresponding edge of each of the sheet bodies parallel to a length of the at least one slot.

12. The electronic package of claim 1, wherein the plurality of sheet bodies are rectangular, and a total width of the at least one slot accounts for at least 1% or more of a side length of a corresponding edge of each of the sheet bodies parallel to a width of the at least one slot.

13. A method of manufacturing an electronic package, comprising:
forming a plurality of conductive pillars and disposing an electronic element on a first circuit structure;
forming a cladding layer on the first circuit structure to cover the plurality of conductive pillars and the electronic element; and
forming a second circuit structure on the cladding layer, wherein the plurality of conductive pillars are electrically connected to the first circuit structure and the second circuit structure, and the electronic element is electrically connected to the first circuit structure or the second circuit structure, wherein the first circuit structure and the second circuit structure include a fan-out redistribution layer, and at least one ground layer is disposed in at least one of the first circuit structure and the second circuit structure, and wherein the at least one ground layer includes a plurality of sheet bodies arranged in an array, and at least one slot is disposed between any two adjacent ones of the sheet bodies.

14. The method of claim 13, wherein at least one of the first circuit structure and the second circuit structure is provided with a plurality of the ground layers, and positions of the sheet bodies of any two adjacent ones of the ground layers are vertically corresponding to each other, and the slots of any two adjacent ones of the ground layers are free from overlapping in a vertical direction.

15. The method of claim 14, further comprising forming a plurality of conductors respectively corresponding to the plurality of sheet bodies and between the any two adjacent ones of the ground layers, wherein the sheet bodies of the any two adjacent ones of the ground layers are electrically connected via at least one of the plurality of conductors.

16. The method of claim 13, wherein each of the sheet bodies has at least one hole.

17. The method of claim 16, wherein at least one of the first circuit structure and the second circuit structure is provided with a plurality of the ground layers, and positions of the sheet bodies of any two adjacent ones of the ground layers are vertically corresponding to each other, and the holes of the any two adjacent ones of the ground layers are free from overlapping in a vertical direction.

18. The method of claim 16, wherein a total area of all the holes on each of the sheet bodies accounts for at least 10% or more of an area of a vertical projection of an outer contour of each of the sheet bodies.

19. The method of claim 13, wherein the at least one slot is disposed at a position corresponding to a central position of an edge of each of the sheet bodies.

20. The method of claim 13, wherein a plurality of slots arranged in an array are disposed between any two adjacent ones of the plurality of sheet bodies.

21. The method of claim 13, wherein the plurality of slots formed between the plurality of sheet bodies are communicated with each other to form a cross-shaped slotted hole at a position corresponding to a corner of each of the sheet bodies.

22. The method of claim 21, wherein a plurality of slots arranged in an array are disposed between the adjacent cross-shaped slotted holes and positioned corresponding to a central position of an edge of the sheet body.

23. The method of claim 13, wherein the plurality of sheet bodies are rectangular, and a total length of the at least one slot accounts for at least 60% or more of a side length of a corresponding edge of each of the sheet bodies parallel to a length of the at least one slot.

24. The method of claim 13, wherein the plurality of sheet bodies are rectangular, and a total width of the at least one slot accounts for at least 1% or more of a side length of a corresponding edge of each of the sheet bodies parallel to a width of the at least one slot.

* * * * *